United States Patent [19]

Matsuo et al.

[11] Patent Number: 5,003,152
[45] Date of Patent: Mar. 26, 1991

[54] MICROWAVE TRANSFORMING METHOD AND PLASMA PROCESSING

[75] Inventors: Seitaro Matsuo, Atsugi; Hiroshi Nishimura, Zama; Mikiho Kiuchi, Ebina, all of Japan

[73] Assignee: Nippon Telegraph and Telephone Corporation, Tokyo, Japan

[21] Appl. No.: 273,518

[22] PCT Filed: Apr. 25, 1988

[86] PCT No.: PCT/JP88/00401
§ 371 Date: Oct. 19, 1988
§ 102(e) Date: Oct. 19, 1988

[87] PCT Pub. No.: WO88/08659
PCT Pub. Date: Nov. 3, 1988

[30] Foreign Application Priority Data

Apr. 27, 1987 [JP] Japan ............................... 62-103785
Apr. 22, 1988 [JP] Japan ................................. 63-98330

[51] Int. Cl.$^5$ ..................... B23K 9/00; C23C 14/34; C23C 13/08
[52] U.S. Cl. ..................... 219/121.59; 219/121.4; 219/121.43; 219/10.55 F; 156/646; 204/298.23
[58] Field of Search ............ 219/10.55 F, 121.4, 219/121.43, 121.42, 121.36, 10.55 R; 156/345, 646, 643; 204/192, 298 MW; 315/111.21, 111.41; 427/45.1; 118/723, 724

[56] References Cited

U.S. PATENT DOCUMENTS

| | | | |
|---|---|---|---|
| 3,740,514 | 6/1973 | Anderson | 219/10.55 F |
| 3,783,221 | 1/1974 | Soulier | 219/10.55 F |
| 4,401,054 | 8/1983 | Matsuo et al. | 118/723 |
| 4,450,031 | 5/1984 | Ono et al. | 219/121.4 |
| 4,492,620 | 1/1985 | Matsuo et al. | 219/121.43 |
| 4,678,644 | 7/1987 | Fukuta et al. | 204/298 MW |
| 4,776,918 | 10/1988 | Otsubo et al. | 204/298 MW |
| 4,778,561 | 10/1988 | Ghanbari | 204/298 MW |
| 4,877,509 | 10/1989 | Ogawa et al. | 204/298 MW |

FOREIGN PATENT DOCUMENTS

| | | |
|---|---|---|
| 209109 | 1/1987 | European Pat. Off. . |
| 120525 | 6/1985 | Japan . |
| 225902 | 10/1986 | Japan . |
| 284098 | 12/1986 | Japan . |
| 53920 | 11/1987 | Japan . |

Primary Examiner—M. H. Paschall
Attorney, Agent, or Firm—Spencer & Frank

[57] ABSTRACT

In a plasma processing apparatus, a gas to be activated into a plasma is introduced into a plasma formation chamber through a gas introducing pipe. Input microwave energy from a microwave source is also supplied to the plasma formation chamber, so that the introduced gas is activated into the plasma by electron cyclotron resonance. The input microwave energy in a TE mode from the microwave source is received by a tapered waveguide in which a dielectric plate is accommodated, so that at least a part of the input microwave energy is transformed into microwave energy in a TM mode or hybrid mode having an electric field component in the direction of the propagation of the input microwave. Microwave energy in both the modes is introduced into the plasma formation chamber through a microwave introducing window. As a result, the microwave energy in the propagation mode having an electric field component or a longitudinal wave component which is parallel to the direction of the microwave propagation is introduced into the plasma formation chamber. The microwave energy is efficiently supplied to the plasma region which satisfies the ECR conditions and then is absorbed by the plasma. Thus the efficiency of the plasma formation is enhanced and accordingly the throughput of the plasma processing is improved.

18 Claims, 20 Drawing Sheets

MICROWAVE TRANSFORMING METHOD AND PLASMA PROCESSING

TECHNICAL FIELD

The present invention relates to an improvement of a plasma processing method and apparatus and a mode transformer for the plasma processing apparatus of the type having a plasma formation chamber into which a gas to be formed into plasma is introduced and means for supplying microwave, which forms the gas introduced into the plasma formation chamber into the plasma, into the plasma formation chamber through a microwave introduction window formed in the plasma formation chamber.

BACKGROUND ART

As the plasma processing apparatuses of the type described above, the followings are known, for instance:
U.S. Pat. No. 4,401,054
"Plasma Deposition Apparatus"
U.S. Pat. No. 4,492,620
"Plasma Deposition Method and Apparatus"
U.S. Pat. No. 4,450,031
"Ion Shower Apparatus"
Japanese Patent Application Laying-Open No. 60-120,525 (Patent Application No. 58-228645)
"A Reactive Ion Etching Method".

The construction of a typical example of the above-mentioned plasma processing apparatuses is shown in FIG. 2.

In FIG. 2, reference numeral 10 denotes a specimen chamber; 20, a plasma formation chamber; and 30, a microwave supply means.

The specimen chamber 10 has a specimen table 11 on which a specimen (wafer, for instance) 40 is mounted and is communicated through gas holes 12 with an exhaust passage 13.

The plasma formation chamber 20 is communicated with the specimen chamber 10 through a plasma extracting orifice 21 on the side opposite the gas holes 12 and a first gas is introduced into the chamber 20 through a first gas introduction system or pipe 22 from a first gas source outside of the chamber 20. An annular pipe 23 having a plurality of small holes is disposed in the vicinity of the outside portion of the orifice 21, so that a second gas is introduced from a second gas source through a second gas introduction system or pipe 24 into the specimen chamber 10. A cooling ring portion 25 surrounds the chamber 20 and a coolant such as water is supplied to the cooling ring portion 25 through a cooling pipe 26 from a coolant source.

A microwave introducing window 27, which is, for instance, made of a silica glass plate is disposed on the end wall of the plasma formation chamber 20 on the side opposite the orifice 21. The microwave from the microwave supply means 30 is introduced into the plasma formation chamber 20 through the window 27, so that the first gas introduced into the chamber 20 through the gas introduction pipe 22 is formed into the plasma.

The microwave supply means 30 comprises a microwave source 31 such as a magnetron which generates microwave having a frequency of, for instance, 2.45 GHz, rectangular waveguides 32 and 33 for propagating the microwave from the microwave source 31 toward the window 27 and a matching tuner 34 interposed between the waveguides 32 and 33. In this case, the microwave is propagated in the TE mode into the plasma formation chamber 20 through the microwave introduction window 27. Thus, the microwave propagated through the introducing window 27 from the rectangular waveguide 33 excites the first gas introduced into the plasma formation chamber 20 to form the plasma.

Electromagnetic coils 50 are disposed to surround the plasma formation chamber 20 in such a way that the plasma of the first gas formed by the electron cyclotron resonance of the introduced microwave is introduced into the specimen chamber 10 through the plasma extracting orifice 21.

The conventional plasma processing apparatus has in general the construction just described above.

In the case of the plasma processing apparatus of the type described above, the specimens 40 which are mounted on the specimen table 11 are effectively processed by the plasma thus produced, so that the plasma etching or deposition can be accomplished.

The plasma processing apparatus of the type utilizing plasma formed by the electron cyclotron resonance (ECR) has a variety of features. When they are applied to CVD, various thin films such as $SiO_2$, $Si_3N_4$ and so on which have a high degree of density and also a high quality can be manufactured at a low temperature without heating and furthermore the damages to the substrate can be minimized. In the application to an etching process, the plasma processing apparatus has features of a high accuracy, a high selection ratio and minimum damage, so that the apparatus is essential in the case of the future fabrication of VLSI circuits.

In the case of the above-described conventional plasma processing apparatus, however, the microwave which excites the gas introduced into the plasma formation chamber 20 is in the TE mode, so that the reflection of the microwave from the plasma formation chamber 20 is high. Consequently, the plasma formation becomes unstable and therefore there was the problem that the first gas cannot be excited effectively.

In addition, the conventional plasma processing apparatus is basically so designed and constructed to process specimens one by one. Therefore, the throughput characteristics such as a processing rate and so on are not sufficient and accordingly there has been a great demand for improving these characteristics. In other words, it is required that an intensity of plasma and an ion current density be increased without deteriorating other advantages.

DISCLOSURE OF THE INVENTION

In view of the above, it is an object of the present invention to provide an improved plasma processing method and apparatus and a mode transformer for the plasma processing apparatus which substantially solve the above-described problems to improve the throughput and to form plasma in a stable manner.

It is another object of the present invention to provide a plasma processing method and apparatus and a mode transformer for the plasma processing apparatus in which the rectangular waveguide mode (generally $TE_{10}$ mode) is transformed into a mode which is easily coupled with the propagation mode in the plasma and then the microwave thus mode-transformed is introduced into the plasma formation chamber, so that the plasma formation efficiency is improved, based upon the results of various observations of microwave characteristics of the microwave propagating through the plasma.

In order to achieve the above objects, in a plasma processing method in which a gas to be activated into a plasma is introduced into a plasma formation chamber and an input microwave from a microwave source is supplied to the plasma formation chamber, so that the gas is activated into the plasma by electron cyclotron resonance, a plasma processing method in accordance with the present invention comprises the steps of:

receiving the input microwave in a first mode from the microwave source;

transforming at least a part of the input microwave into a microwave in a second mode having an electric field component in the direction of the propagation of the input microwave; and introducing a microwave in a hybrid mode containing microwaves in the first and second modes into the plasma formation chamber through a microwave introducing window.

Here, the input microwave from the microwave source may be propagated in a TE mode through a rectangular waveguide; at least a part of the microwave in the TE mode may be transformed into a microwave in a TM mode; and a microwave in a hybrid mode containing the TE and TM modes may be supplied to the plasma formation chamber.

In a plasma processing apparatus having a microwave source for generating an input microwave and a plasma formation chamber into which a gas to be activated into a plasma is introduced and to which the input microwave from the microwave source is supplied through a microwave introducing window provided in the plasma formation chamber, so that the gas is activated into the plasma by electron cyclotron resonance, a plasma processing apparatus in accordance with the present invention comprises:

a transformer receiving the input microwave in a first mode from the microwave source; and for transforming at least a part of the input microwave into a microwave in a second mode having an electric field component in the direction of the propagation of the input microwave, a microwave in a hybrid mode containing the first and second modes being introduced into the plasma formation chamber through the microwave introducing window.

Here, the transformer may have a first waveguide and a dielectric member disposed in and extending through the first waveguide.

In this plasma processing apparatus, the first waveguide may be a circular waveguide, and the plasma processing apparatus may further comprise a rectangular waveguide for propagating in a TE mode the input microwave from the microwave source and a tapered waveguide interposed between the rectangular waveguide and the circular waveguide, and in the circular waveguide, at least a part of the microwave in the TE mode introduced into the circular waveguide from the tapered waveguide being transformed into a microwave in a TM mode, and a microwave in a hybrid mode containing the TE and TM modes being derived from the circular waveguide.

Alternatively, in the plasma processing apparatus, the first waveguide may be a tapered waveguide, and the plasma processing apparatus may further comprise a rectangular waveguide for propagating in a TE mode the input microwave from the microwave source, the microwave in the TE mode from the rectangular waveguide being introduced into the tapered waveguide, so that at least a part of the introduced microwave in the TE mode may be transformed into a microwave in a TM mode, and a microwave in a hybrid mode containing the TE and TM modes may be derived from the tapered waveguide.

The dielectric member may be a dielectric plate which is disposed in parallel with the direction of the propagation of the input microwave introduced into the transformer and perpendicular to the direction of the electric field of the input microwave introduced into the transformer.

The first waveguide may have grooves for guiding the dielectric plate.

The dielectric plate may be a silica glass plate.

The plasma processing apparatus may further comprise a second dielectric plate disposed on the microwave introducing window.

In a plasma processing apparatus having a microwave source for generating an input microwave and a plasma formation chamber into which a gas to be activated into a plasma is introduced and to which the input microwave from the microwave source is supplied through a microwave introducing window provided in the plasma formation chamber, so that the gas is activated into the plasma by electron cyclotron resonance, a mode transformer for the plasma processing apparatus in accordance with the present invention comprises:

a first member receiving the input microwave in a first mode from the microwave source and for transforming at least a part of the input microwave into a microwave in a second mode having an electric field component in the direction of the propagation of the input microwave; and a second member for introducing a microwave in a hybrid mode containing the first and second modes into the plasma formation chamber through the microwave introducing window.

Here, the second member may have a first waveguide and the first member has a dielectric member disposed in and extending through the first waveguide.

In this mode transformer, the first waveguide may be a circular waveguide, and the mode transformer may further comprise a rectangular waveguide for propagating in a TE mode the input microwave from the microwave source and a tapered waveguide interposed between the rectangular waveguide and the circular waveguide, and in the circular waveguide, at least a part of the microwave in the TE mode introduced into the circular waveguide from the tapered waveguide being transformed into a microwave in a TM mode, and a microwave in a hybrid mode containing the TE and TM modes being derived from the circular waveguide.

Alternatively, the first waveguide may be a tapered waveguide, and the mode transformer may further comprise a rectangular waveguide for propagating in a TE mode the input microwave from the microwave source, the microwave in the TE mode from the rectangular waveguide being introduced into the tapered waveguide, so that at least a part of the introduced microwave in the TE mode may be transformed into a microwave in a TM mode, and a microwave in a hybrid mode containing the TE and TM modes may be derived from the tapered waveguide.

The dielectric member may be a dielectric plate which is disposed in parallel with the direction of the propagation of the input microwave introduced into the mode transformer and perpendicular to the direction of the electric field of the input microwave introduced into the mode transformer.

The first waveguide may have grooves for guiding the dielectric plate.

The dielectric plate may be a silica glass plate.

The mode transformer may further comprise a second dielectric plate disposed on the microwave introducing window.

In the plasma processing apparatus in accordance with the present invention, a microwave supply means performs a mode transformation in such a manner that instead of the microwave in the TE mode, the microwave in a hybrid mode of TE and TM modes or in a TM mode is supplied to the plasma formation chamber.

In order to generate ECR plasma efficiently with introducing microwave, it is important to clarify manners how the microwave propagates through the plasma and how the microwave is absorbed. With respect to the propagation of microwave in plasma, it is usually frequently discussed based upon the approximation by plane wave, and it has not been sufficiently analyzed how handling such as rolls of right-handed rotating wave and left-handed rotating wave corresponds to actual formation of the plasma.

In general, a radius of ECR plasma is of the order of 10 cm and is almost equal to the order of the wavelength of the microwave. Consequently, the analysis obtained by the approximation by the plane wave is not sufficient. Therefore, the inventors have theoretically analyzed the characteristics of the microwave propagation in the magnetically confined plasma, with sufficiently considering the influence by the walls of the plasma formation chamber.

Hereinafter, the characteristics of the microwave propagating in the axial direction (Z-direction) when a uniform static magnetic field in the axial direction and a uniform plasma exist in a cylindrical metal container (having a radius of r) will be generally discussed.

A fundamental equation is derived from Maxwell's equation and the property of the plasma confined in the magnetic field is expressed in the form of a dielectric constant tensor. An electric field and a magnetic field of microwave which propagates in the axial (the Z-direction) is expressed as follows:

$$\mathbb{E} = \mathbb{E}(x,y) e^{i(\omega t - kz)}, \quad \mathbb{H} = \mathbb{H}(x,y) e^{i(\omega t - kz)}$$

and a dielectric constant tensor of the microwave is defined as follows:

$$\epsilon = \begin{pmatrix} \epsilon_1 & i\epsilon_2 & 0 \\ -i\epsilon_2 & \epsilon_1 & 0 \\ 0 & 0 & \epsilon_3 \end{pmatrix}. \tag{1}$$

Here, $$\left. \begin{array}{l} \epsilon_1 = \epsilon_0 \left( 1 - \dfrac{\omega_p^2}{\omega^2 - \omega_c^2} \right) \\[6pt] \epsilon_2 = \epsilon_0 \left( \dfrac{-\omega_p^2 \omega_c}{\omega(\omega^2 - \omega_c^2)} \right) \\[6pt] \epsilon_3 = \epsilon_0 \left( 1 - \dfrac{\omega_p^2}{\omega^2} \right) \end{array} \right\} \tag{2}$$

where $\epsilon_0$ is a dielectric constant in vacuum; $\omega_p$ is a frequency of the plasma and $\omega_c$ is a frequency of electron cyclotron.

The TE wave of the microwave electric and magnetic fields $\mathbb{E}(x,y)$ and $\mathbb{H}(x,y)$ is obtained by obtaining Hz. Hz satisfies the following equation (where $\mu_o$: permeability in vacuum).

$$\frac{\partial^2 Hz}{\partial x^2} + \frac{\partial^2 Hz}{\partial y^2} + \left( \mu_0 \left( \epsilon_1 - \frac{\epsilon_2^2}{\epsilon_1} \right) \omega^2 - k^2 \right) Hz = \\ -ik\omega \frac{\epsilon_2 \epsilon_3}{\epsilon_1} Ez \tag{3}$$

The TM wave is obtained by obtaining Ez. Ez satisfies the following equation.

$$\frac{\partial^2 Ez}{\partial x^2} + \frac{\partial^2 Ez}{\partial y^2} + \frac{\epsilon_3}{\epsilon_1} (\mu_0 \epsilon_1 \omega^2 - k^2) Ez = ik\omega \mu_0 \frac{\epsilon_2}{\epsilon_1} Hz \tag{4}$$

When the coefficients on the right sides of Equations (3) and (4) are small, Hz and Ez can be approximately separated and becomes TE and TM waves, respectively.

In order to simplify the calculations based upon the qualitative tendency, Hz and Ez are obtained as follows on the assumption that the coefficients on the right sides of Equations (3) and (4) are relatively small.

$$\left. \begin{array}{l} Hz = Hz_o + \alpha Ez_o \\ Ez = Ez_o + \beta Hz_o \end{array} \right\} \tag{5}$$

Here, $Hz_o$ and $Ez_o$ are the solutions, respectively, when the right sides of Equations (3) and (4) are made equal to zero. The coefficients on the right sides of Equations (3) and (4) affect $\alpha$ and $\beta$. According to this approximation, the dispersion relations are obtained.

As a boundary condition, there is a metal cylindrical wall having the radius of $r=a$, where the electric field components in parallel with the cylindrical wall must be zero. Under these conditions, the dispersion relationship concerning the wave which is propagable is obtained. That is, corresponding respectively to the first equation and the second equation in Equation (5), the propagation characteristics of the hybrid waves consisting of the HE wave (quasi-TE wave) and the EH wave (quasi-TM wave) are obtained.

Examples of the calculations of the dispersion relationships of the HE wave and the EH wave are illustrated in FIGS. 11 and 12, in which $\omega_p/\omega_c = 1.5$; $\omega_c = 3$ GHz and $r = 10$ cm. The HE wave is resonated at $\omega_c$ and $$\omega_H \left( = \sqrt{\omega_c^2 + \omega_p^2} \right):$$

hybrid resonance frequency). The EH wave is resonated at $\omega_c$ and $\omega_p$. Furthermore, in the case of the EH wave, there is no difference between the right-handed wave (n=1) and the left-handed wave (n=-1) and the difference is very small even in the case of the HE wave. The mode extending from a point in the vicinity of the origin is the mode which becomes newly propagable because of the existence of the plasma and the static magnetic field. In the case of the HE wave, the electric field is strong in the peripheral portion, while in the case of the EH wave, the electric field is also strong in the center portion. Under the condition that the plasma has a low density ($\omega_p < \omega_c$), this mode of the EH wave resonates at $\omega_p$, but under the condition that the plasma has a high density ($\omega_p > \omega_c$), this mode resonates at mc.

In order to generate plasma with a high strength in a stable manner, the mode of the EH wave (the hybrid wave) from the origin, which resonates at the electron cyclotron resonance frequency $\omega_c$ which is independent of the plasma density is stable in the case of forming the plasma at a high density and the positive utilization of this mode is considered to be effective in order to increase the plasma formation efficiency and the throughput of the ECR plasma process.

The present invention was made based upon the above-described analysis and consideration and according to a plasma processing apparatus in accordance with the present invention, the microwave which excites the first gas introduced into the plasma formation chamber has an electric field component in the same direction as the direction of the microwave propagation, so that the microwave is satisfactorily absorbed by the plasma. As a result, the reflection of the microwave from the plasma formation chamber hardly occurs and even if the reflection occurs, it is negligibly small. Therefore, as compared with the conventional plasma processing apparatus as shown in FIG. 2, the introduced gas is effectively excited by such microwave.

Further, in the case of the approximation by plane wave, electron cyclotron resonance does not occur when a left-handed and circularly polarized wave is used, and accordingly in conventional nuclear fusion plasma technology, there has been known a mode transformation method for transforming a linearly polarized wave into a right-handed and circularly polarized wave (For instance, "Measurement of Power Transfer Efficiency from Microwave Field to Plasma under ECR Condition" by Yuichi Sakamoto, Japanese Journal of Applied Physics, Vol. 16, No. 11, Nov., 1977 (pp.1993–1998), or "40.5 Electron Cyclotron Resonance Heating" Experimental Physics Series 30 "Plasma Nuclear Fusion", pp548–564, Dec. 5, 1979, published by Kyoritsu Shuppan Sha). This method is based upon the approximation utilizing a plane wave and can be considered to be correct in the nuclear fusion field. However, it has been realized that in the case of the formation of plasma having a small u volume which has a dimension (of the order of 10 cm) almost equal to the wavelength of the microwave, like in the case of the ECR plasma, the approximation by the plane wave is not effective.

In the case of the approximation by the plane wave, the reflection and interference of the microwave are not taken into consideration, so that the theoretical analysis must be made with sufficient consideration of the fact that the plasma to be analyzed is confined by the wall of the plasma formation chamber which has a small space. According to the present invention, such theoretical analysis was made as described above and the present invention was made based upon the results of such analysis.

The above and other objects, effects, features and advantages of the present invention will become more apparent from the following description of embodiments thereof taken in conjunction with the accompanying drawings.

BEST MODE FOR CARRYING OUT THE INVENTION

First Embodiment: (Plasma Processing Apparatus)

Figure 1:
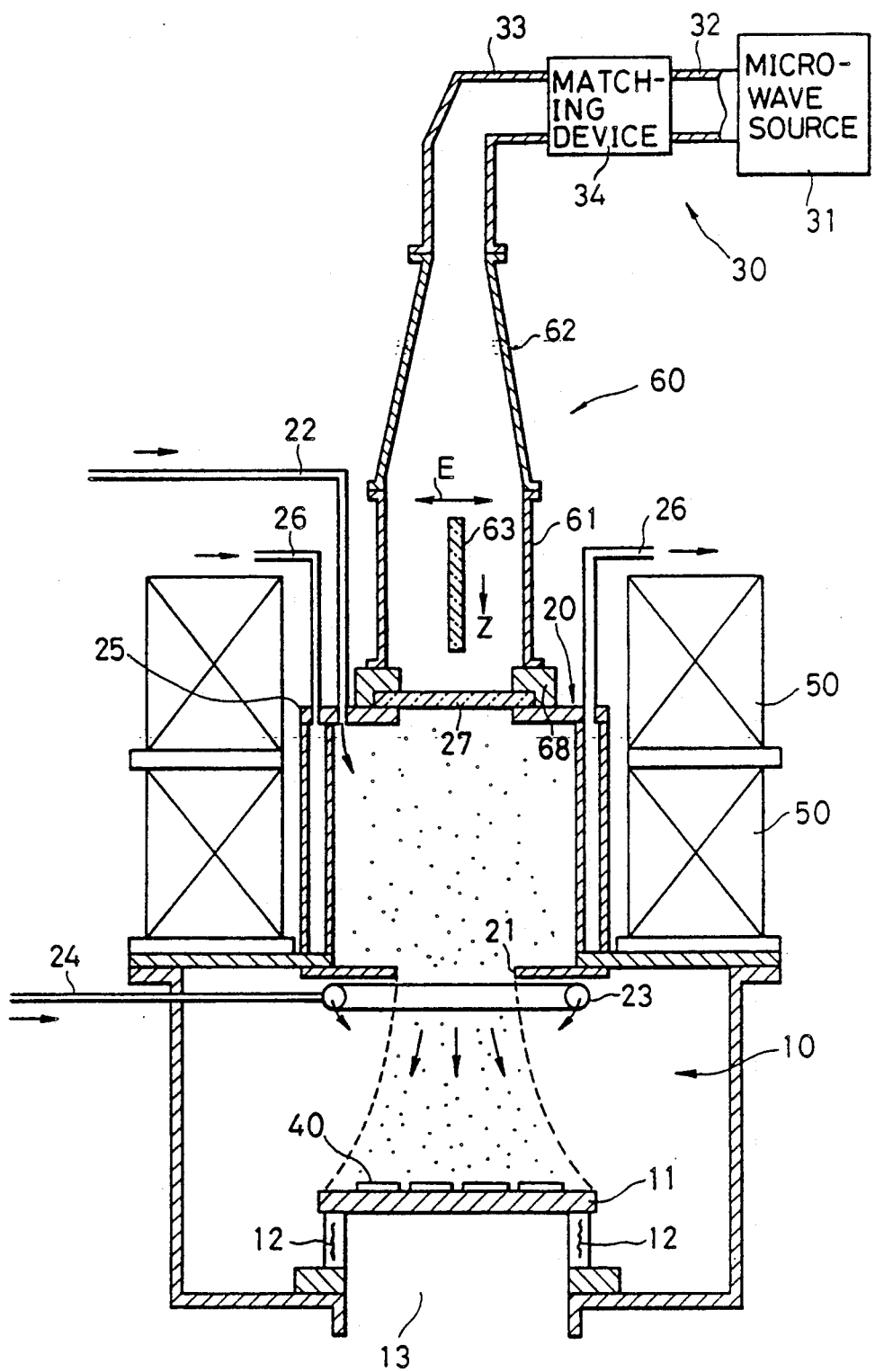
FIG. 1 is a sectional view showing a first embodiment of a plasma processing apparatus in accordance with the present invention.
Figure 2:
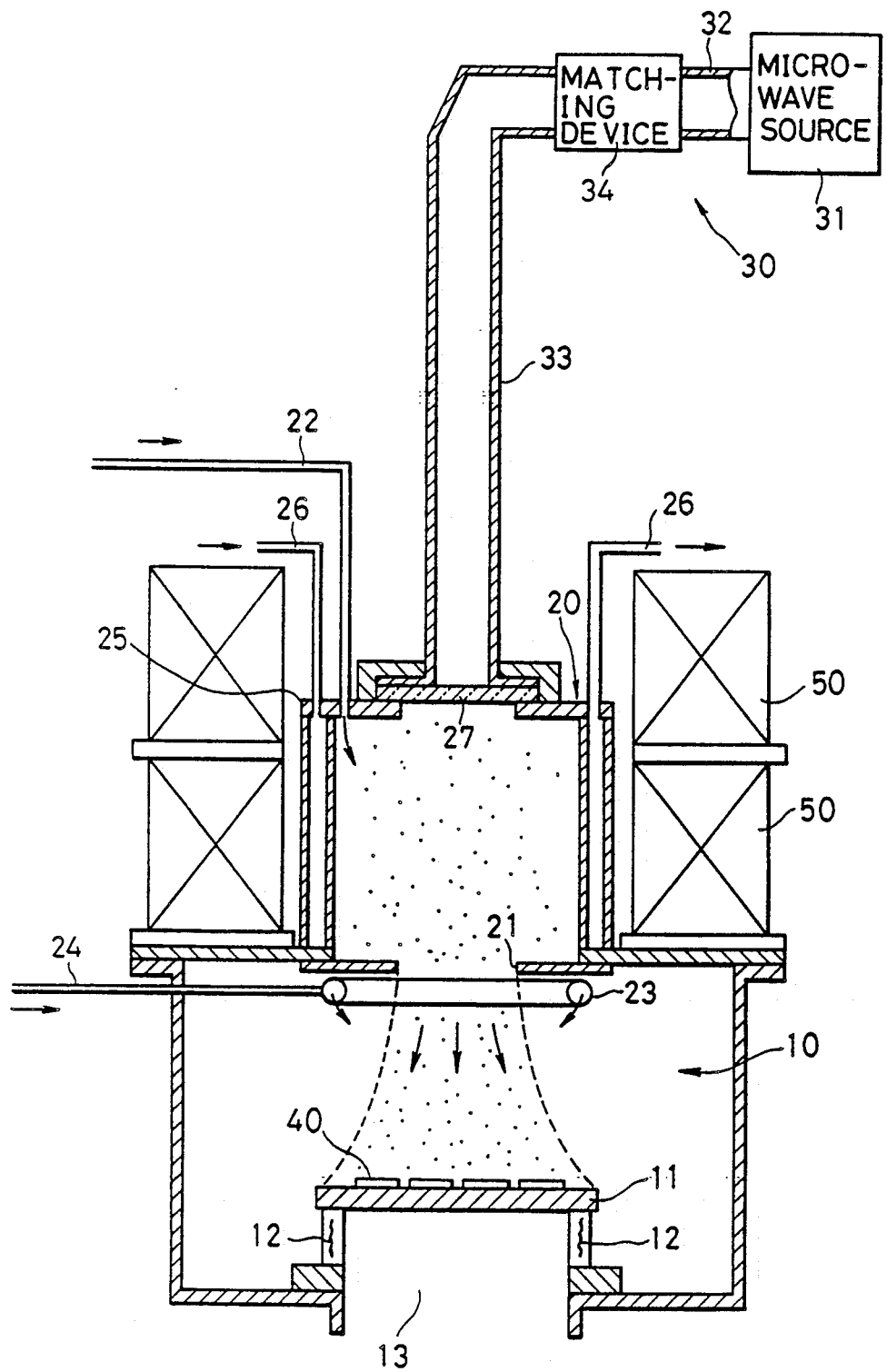
FIG. 2 is a sectional view showing an example of a conventional plasma processing apparatus.
Figure 3:
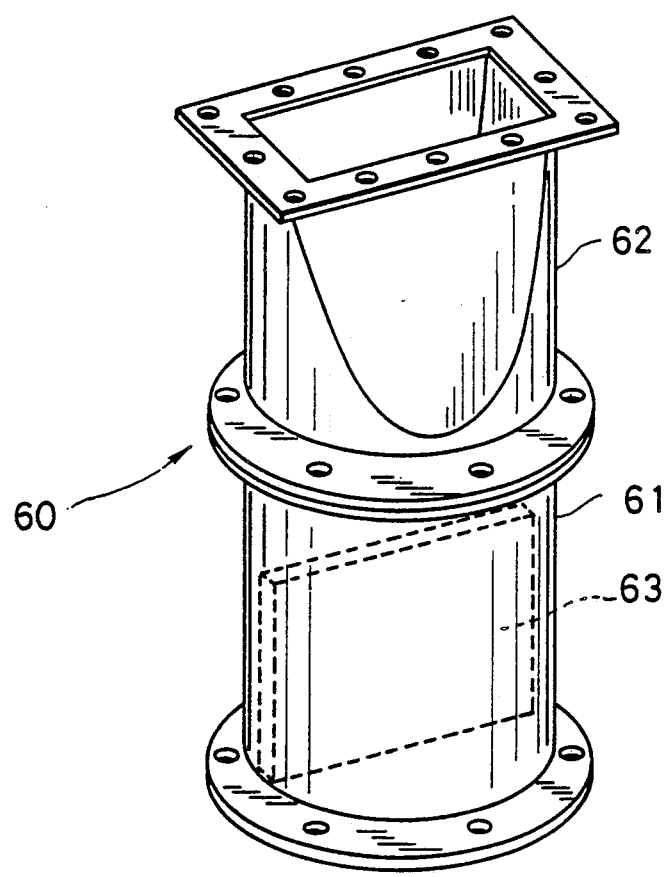
FIG. 3 is a perspective view showing the microwave introduction unit in the first embodiment.

A first embodiment of the present invention is shown in FIGS. 1 and 3, in which the same reference numerals as those used in FIG. 2 are also used to designate the corresponding portions and their details will not be explained here.

In FIGS. 1 and 3, reference numeral 60 denotes a microwave introduction unit comprising a circular waveguide 61 coupled to the microwave introducing window 27, a tapered waveguide which is tapered from a rectangular shape to a circular shape in order to transform the TE wave in the $TE_{10}$ mode in the rectangular waveguide 33 into the TE wave in the $TE_{11}$ mode in the circular waveguide 61 and a dielectric member 63, for example, a silica glass plate which is disposed inside the circular waveguide 61. This plate 63 is disposed in parallel with the direction of the propagation of the microwave introduced into the waveguide 61 and is also perpendicular to the electric field of the microwave. The window 27 is mounted to the plasma formation chamber 20 by a supporting member 68. The circular waveguide 61 is fixed to the supporting member 68.

The microwave which has been propagating in the rectangular waveguide 33 is the TE wave (generally in the $TE_{10}$ mode) whose electric field E is perpendicular to the propagation direction Z. The TE wave is transformed into the TE wave in the $TE_{11}$ mode by the tapered waveguide 62 and is introduced into the circular waveguide 61. A portion of the TE wave introduced into the circular waveguide 61 is transformed into the TM wave in a mode in which the electric field of the microwave has a longitudinal wave component by the dielectric plate 63 and the TM wave is propagated through the circular waveguide 61 toward the microwave introducing window 27.

Figure 4:
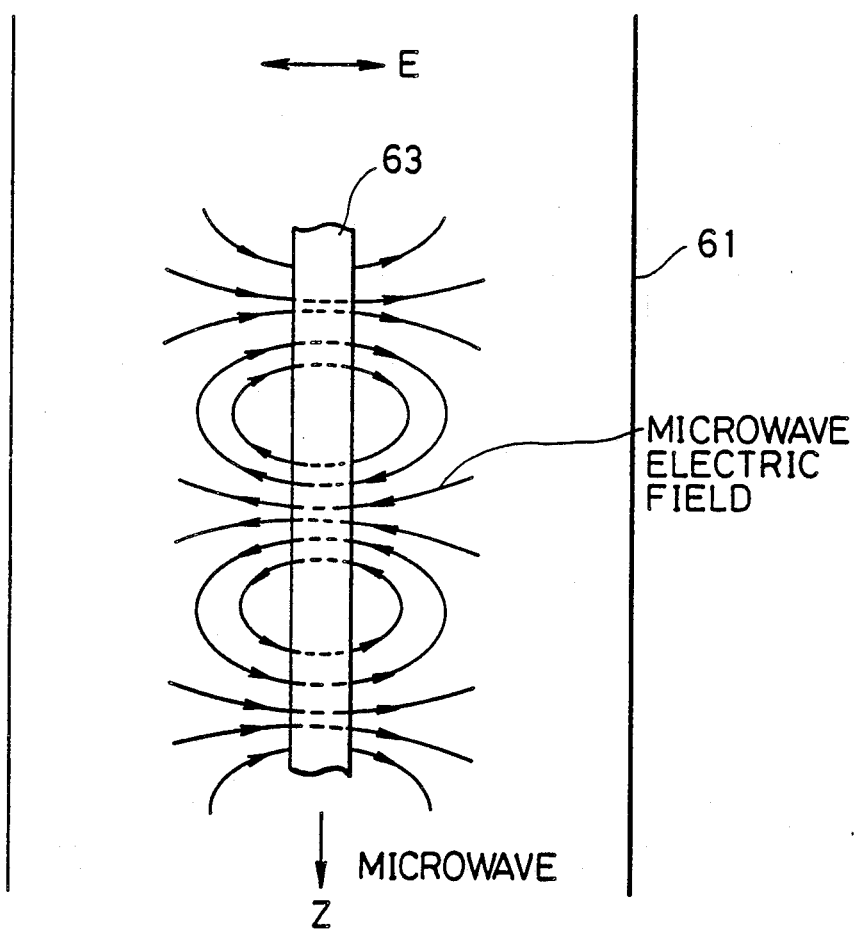
FIG. 4 is a diagram illustrating a distribution of an electric field of the microwave produced around the dielectric member of the microwave waveguide in the first embodiment.

FIG. 4 shows an electric field distribution of the microwave which is produced around the microwave waveguide by the dielectric plate 63. This microwave is the TM wave having electric field components in the same direction as the microwave propagation direction Z.

Therefore, the microwave introduced into the plasma formation chamber 20 through the microwave introducing window 27 is the microwave in the hybrid mode, in which the microwave in the TM mode and the microwave in the $TE_{11}$ mode, into which the microwave from the waveguide 33 is transformed by the tapered waveguide 62 and which is introduced into the circular waveguide 61, coexist. This microwave in the hybrid mode is called HE mode or EH mode microwave, depending upon whether its major mode is the TE mode or TM mode. In the present invention, the microwave in either HE mode or EH mode can be used. In other words, in the present invention, it is sufficient that an electric field having a component in the direction Z of the propagation of the microwave is introduced into the plasma confined in the plasma formation chamber 20.

Then, the electrons in the plasma in spiral motion due to the electronic cyclotron movement around the magnetic field in the Z-direction generated by the electromagnetic coils 50 can satisfactorily interact with the electric field having a component in the Z-direction, so that the stable mode is maintained and therefore the microwave can efficiently propagate to the electron cyclotron resonance region. As a result, the introduced microwave is efficiently absorbed by the plasma, so that the microwave reflected by the plasma is remarkably decreased.

The reason why the electrons in spiral motion easily interact with the electric field having a component in the Z-direction is that the motion of the electrons in the direction perpendicular to the Z-direction is decelerated due to the restricting force by the magnetic field in the Z-direction, but the movement of the electrons in the same direction as the direction of the magnetic field is free without being restricted by the magnetic field.

Second Embodiment: (Plasma Processing Apparatus)

FIGS. 5, 6A, 6B and 7 show a second embodiment of the present invention.

In the second embodiment, the circular waveguide 61 in the first embodiment is eliminated and a dielectric plate 63 is disposed in the tapered waveguide 62 for mode transformation in such a way that the plate 63 is horizontal in the Z-direction of the propagation of the microwave and perpendicular to the electric field E of the microwave. In other words, in the second embodiment, the tapered waveguide 62 and the mode transforming portion consisting of the circular waveguide 61 and the dielectric plate 63 are integrally structured. In this manner, the mode transformer for introducing the microwave can be made compact in size.

Further, reference numerals 65 and 66 denote lower and upper flanges of the tapered waveguide 62, respectively. The lower flange 65 is secured to the supporting member 68.

Figure 7:
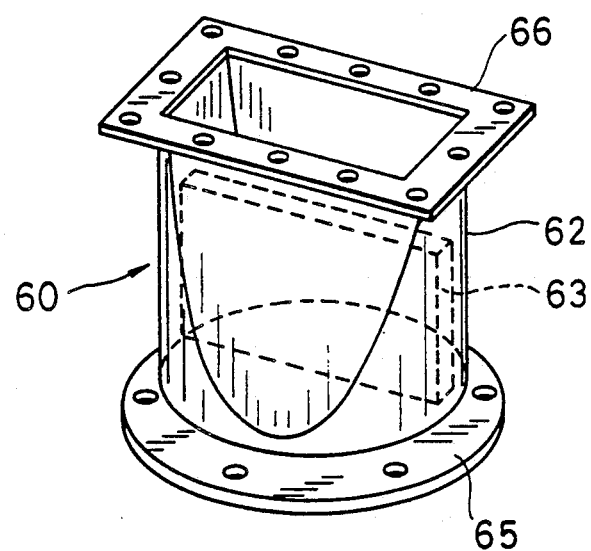
FIG. 7 is a perspective view showing the microwave introduction unit of the second embodiment.

According to the second embodiment, the tapered waveguide 62 is so designed and constructed that the rectangular section of the rectangular waveguide 33 is transformed into a circular section having a diameter substantially equal to the longitudinal length of the rectangular section (for instance, 10 cm$\phi$). The outer appearance of the tapered pipe 62 is shown in FIG. 7. Furthermore, the dielectric plate 63 disposed in the tapered waveguide 62 is made of a silica glass plate having, for instance, a length of 8 cm in the direction of the microwave propagation, a width of 10 cm in the direction perpendicular to the propagation direction and a thickness of 5 mm. The microwave introducing window 27 serves to maintain the plasma formation chamber 20 in a vacuum condition (a low gas pressure) and also to introduce the microwave into the plasma formation chamber 20. In the second embodiment, a silica glass plate having a thickness of 15 mm is used as the window 27.

Figure 8:
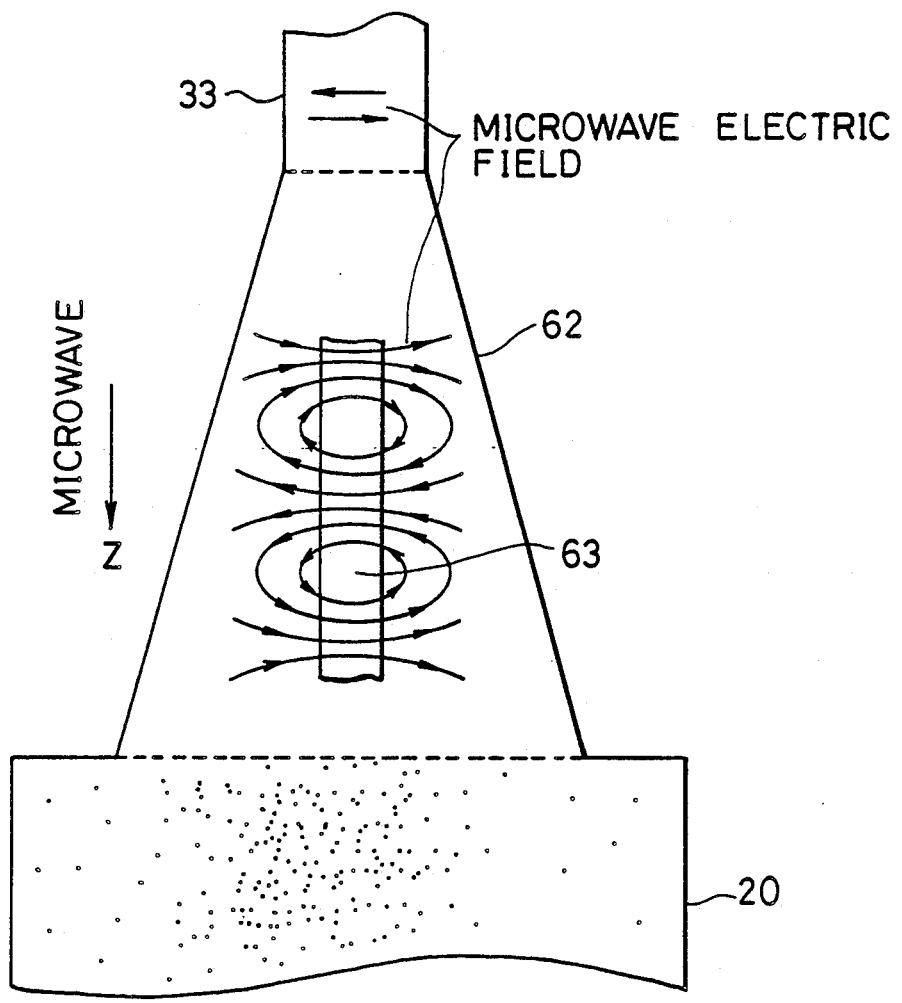
FIG. 8 is a diagram illustrating a distribution of an electric field of the microwave formed around the dielectric member in the microwave guide in the second embodiment.

As shown in FIG. 8, the microwave which has propagated through the rectangular waveguide 33 in the $TE_{10}$ mode is partly transformed into the TM mode wave (the surface wave on the dielectric plate) in the tapered waveguide 62 in which the dielectric plate 63 serves as a transmission line. As a consequence, the TE wave and the TM wave coexist, so that the microwave in the hybrid mode whose electric field has a longitudinal wave component is introduced into the plasma formation chamber 20 through the microwave introducing window 27 and then is combined with and absorbed by the plasma in the chamber 20.

As mentioned above, the plasma, which is confined within a limited space which is substantially equal in size to the wavelength of microwave (or smaller than the wavelength), permits the propagation of electromagnetic wave having a longitudinal wave component. Thus, it is considered that the waveguide mode having an electric field component in the direction of the propagation of the microwave facilitates the introduction of the microwave into the plasma.

Furthermore, because the microwave propagates along the dielectric plate 63, the microwave is hardly adversely affected by the shape of the metal wall of the circular waveguide 61 or the tapered waveguide 62 surrounding the plate 63. Therefore, the complicated instability such as the reflection of the microwave due to the surface unevenness of the metal wall and so on can be eliminated.

Experiments

An oxygen ($O_2$) gas was introduced into the plasma formation chamber 20 from the gas introducing pipe 22 at a flow rate of 5-50 cc/min, so that the gas pressure in the plasma formation chamber 20 was maintained at $10^{-4}$ Torr $-2\times 10^{-3}$ Torr. A current within a wide range between 14A and 22A was supplied to the magnetic coils 50, so that the conditions for generating the electronic cyclotron resonance were established in some region in the plasma formation chamber 20. By adjusting the matching device or tuner 34, the following satisfactory results were obtained.

Furthermore, the ionization rate of the plasma was increased by about three times with the same microwave power introduced. Moreover, the reflection of the microwave was largely reduced, so that it became possible that the microwave having a power higher than the conventionally used microwave is introduced into the plasma formation chamber 20. As compared with the conventional apparatus, an ion current (10-20 mA/cm$^2$) more than ten times as high as the conventional ion current was extracted into the specimen chamber 10 in which the specimens 40 were disposed.

When a pulse-shaped (intermittent oscillation) microwave (intermittent oscillation of 50 Hz and 100 Hz at a frequency of 2.45 GHz), which adversely affects the matching of the microwaves, was used, the reflected wave of 40-50% of the microwave was observed when the microwave power of 200-1000 W was supplied to the conventional apparatus, but in the case of the apparatus in accordance with the present invention, only 2-8% of the microwave was reflected. Thus, the characteristics of the plasma processing apparatus are considerably improved in accordance with the present invention.

So far it has been described that the dielectric member 63 is in the form of plate, but it is apparent that a dielectric member in the form of cylinder may be equally used as the dielectric member 63. In the latter case, a mode of the propagation of the microwave is mainly the HE$_{11}$ mode.

Figure 9A:
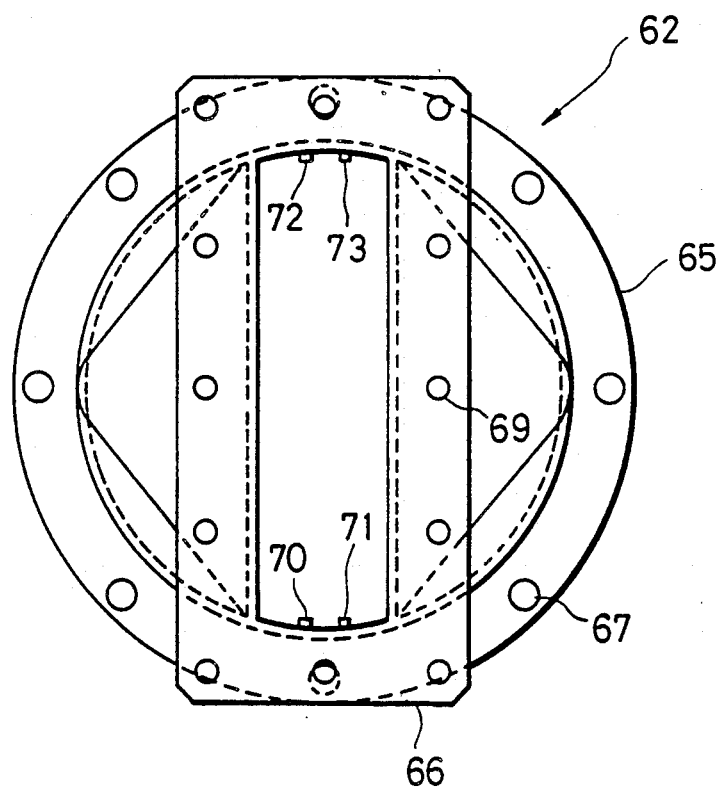
FIGS. 9A and 9B are a top plan view and a sectional view showing an example of a specific structure of the second embodiment, respectively.
Figure 9B:
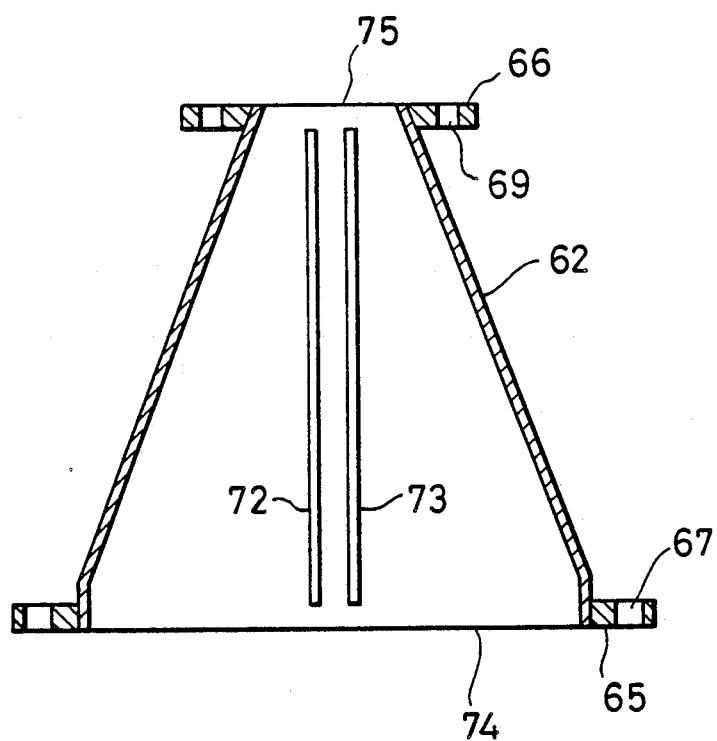

FIGS. 9A and 9B show a specific embodiment of the tapered waveguide 62. Here, reference numeral 67 designates a plurality of holes opened in the lower flange 65. The lower flange 65 is secured to the supporting member 68 of the window 27 by inserting bolts into the holes 67. Reference numeral 69 denotes a plurality of holes opened in the upper flange 66. The upper flange 66 is secured to the rectangular waveguide 33 by inserting bolts into the holes 69. Reference numerals 70 and 71, and reference numerals 72 and 73 designate two pairs of two elongated projection members which are mounted to the inner wall of the tapered waveguide 62 and the members 70 and 71, and 72 and 73 are spaced apart from each other by a predetermined distance, respectively. The pair of the projection members 70 and 71 are opposed to the other pair of the projection members 72 and 73. Grooves defined by the pair of the projection members 70 and 71 and the pair of the projection members 72 and 73 serve to guide the both opposite ends of the silica glass plate 63. The lower end of the silica glass plate 63 may be made into contact with the window 27. Alternatively, the lower ends of the projection members 70-73 may have a member for supporting the silica glass plate 63. Further, reference numeral 74 represents a lower circular opening and reference numeral 75 denotes an upper rectangular opening.

In this embodiment, the tapered waveguide 62 was made of copper and the surfaces thereof were plated with silver. The upper rectangular opening 75 was about 30×90 mm and the lower circular opening 74 was 100 mm in diameter. The tapered waveguide 62 was 110 mm in height. The silica glass plate 63 was 99×80 mm and 5 mm in thickness. The cross section of each of the projection members 70-73 was 2×2 mm and each projection member was 100 mm in length. The spacing between the projection members 70 and 71 and the spacing between the projection members 72 and 73 were 6 mm. The respective lower ends of the projection members 70-73 were spaced apart by 5 mm from the lower circular opening 4, and the respective upper ends of the projection members 70-73 were spaced apart by 5 mm from the upper rectangular opening 75.

Third Embodiment: (Plasma Processing Apparatus)

Figure 5:
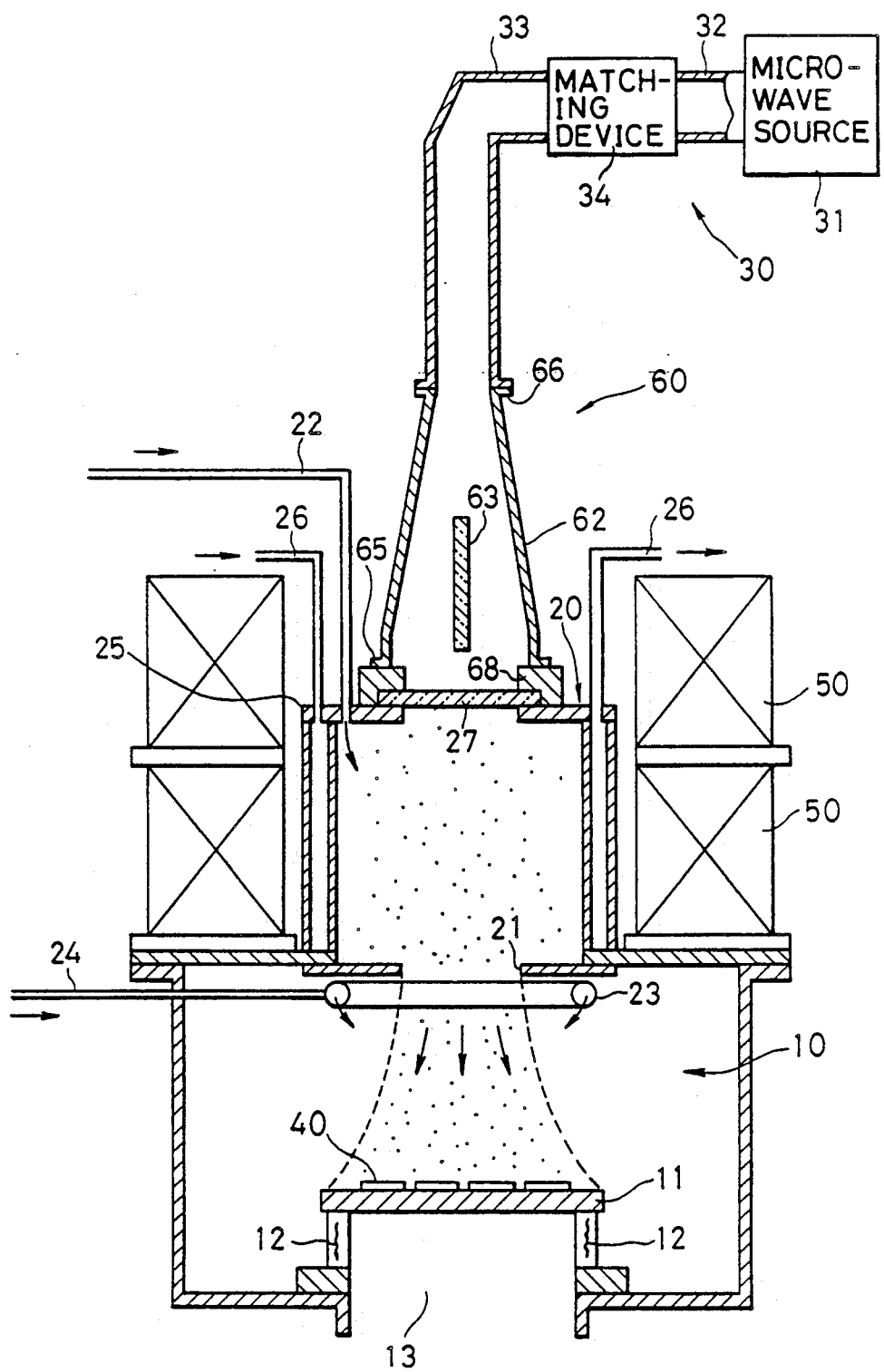
FIG. 5 is a sectional view showing a second embodiment of a plasma processing apparatus in accordance with the present invention.
Figure 6A:
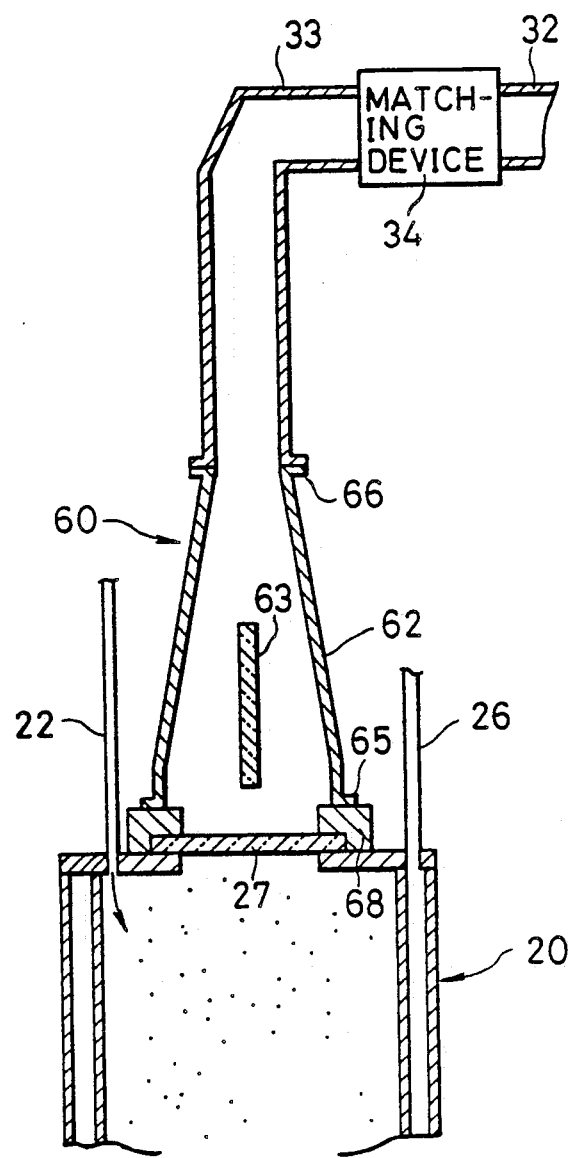
FIGS. 6A and 6B are sectional views showing the microwave introduction unit of the second embodiment.
Figure 6B:
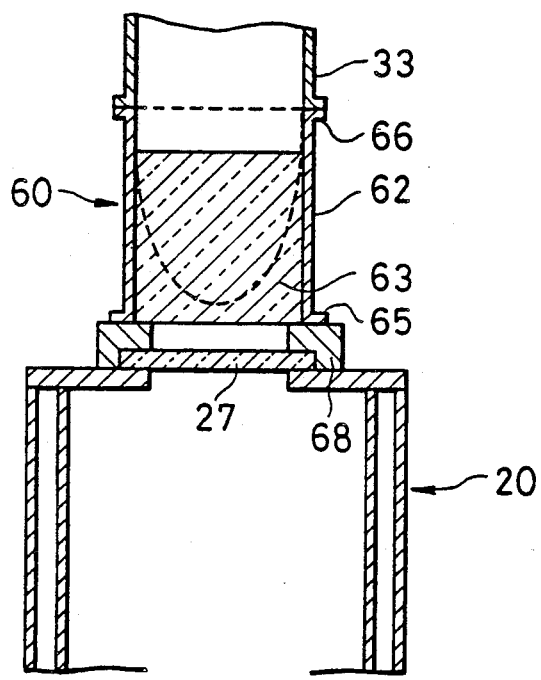
Figure 10:
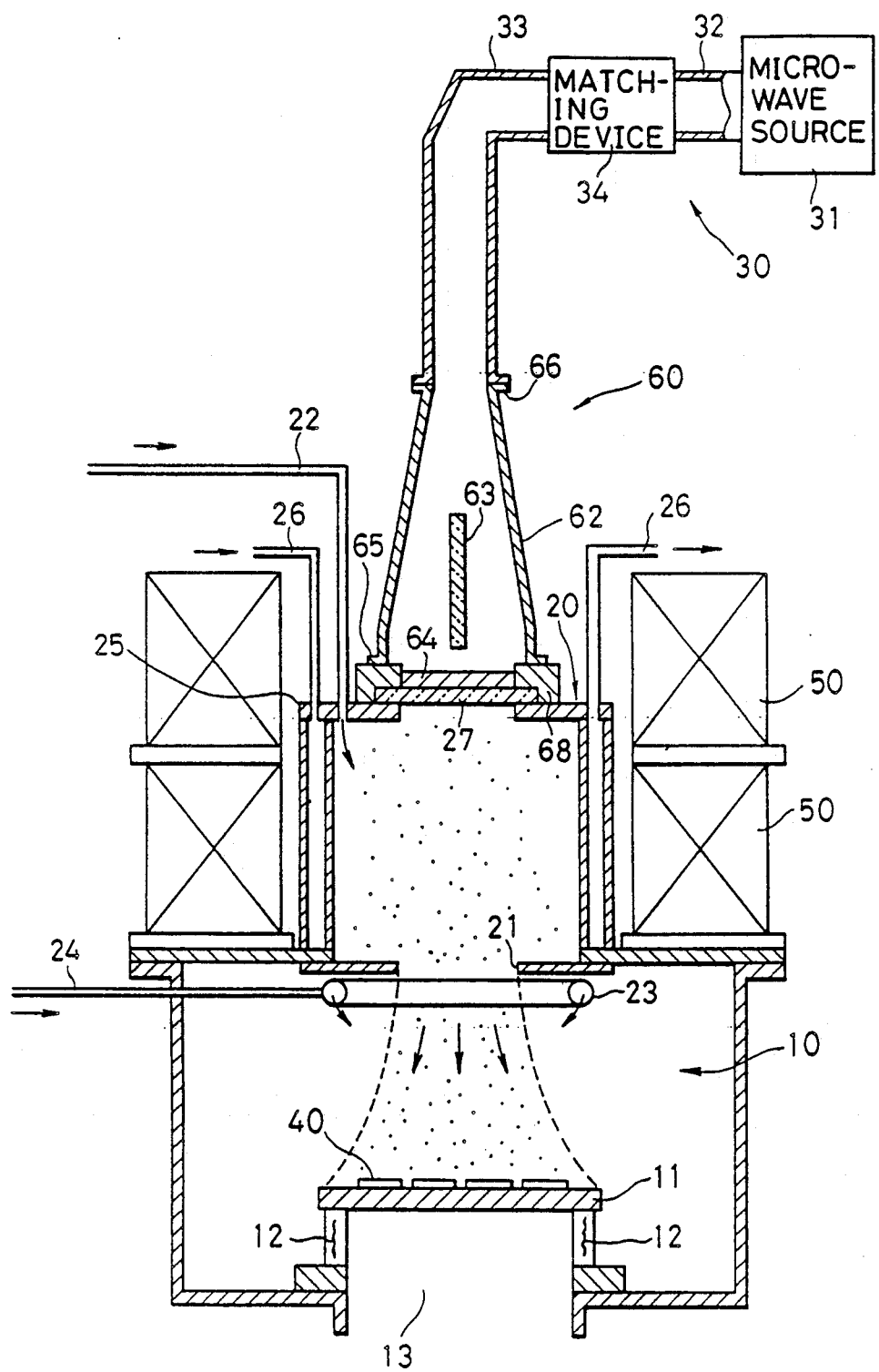
FIG. 10 is a sectional view showing a third embodiment of a plasma processing apparatus in accordance with the present invention.

The third embodiment of the present invention shown in FIG. 10 is a modification of the second embodiment shown in FIG. 5. In this third embodiment, in order to further improve the matching characteristic, another dielectric plate 64 which is, for instance, a PTFE plate of 5-10 mm in thickness is superposed on the microwave introducing window 27.

Furthermore, the matching characteristics of various ECR plasma processing apparatus were optimized by changing the length (5-10 cm in the experiments) of the dielectric plate 63 inserted into the mode transforming portion.

Figure 11:
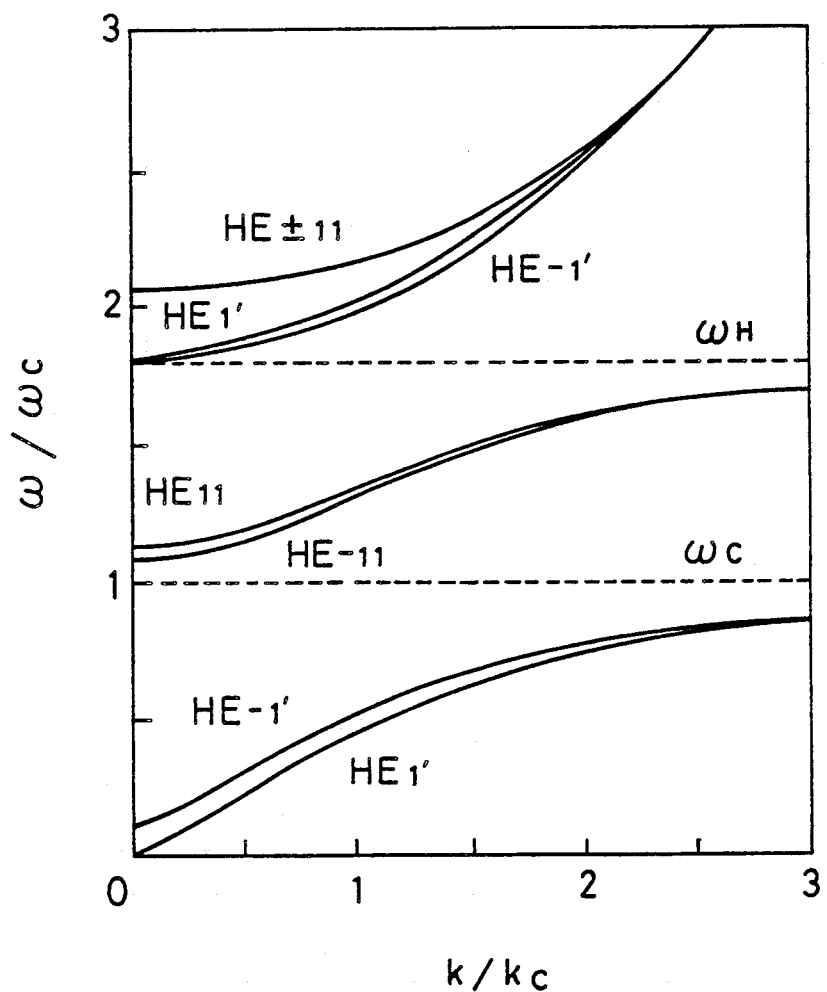
FIGS. 11 and 12 are characteristic charts illustrating the dispersion relationships of the HE wave and the EH wave, respectively.
Figure 12:
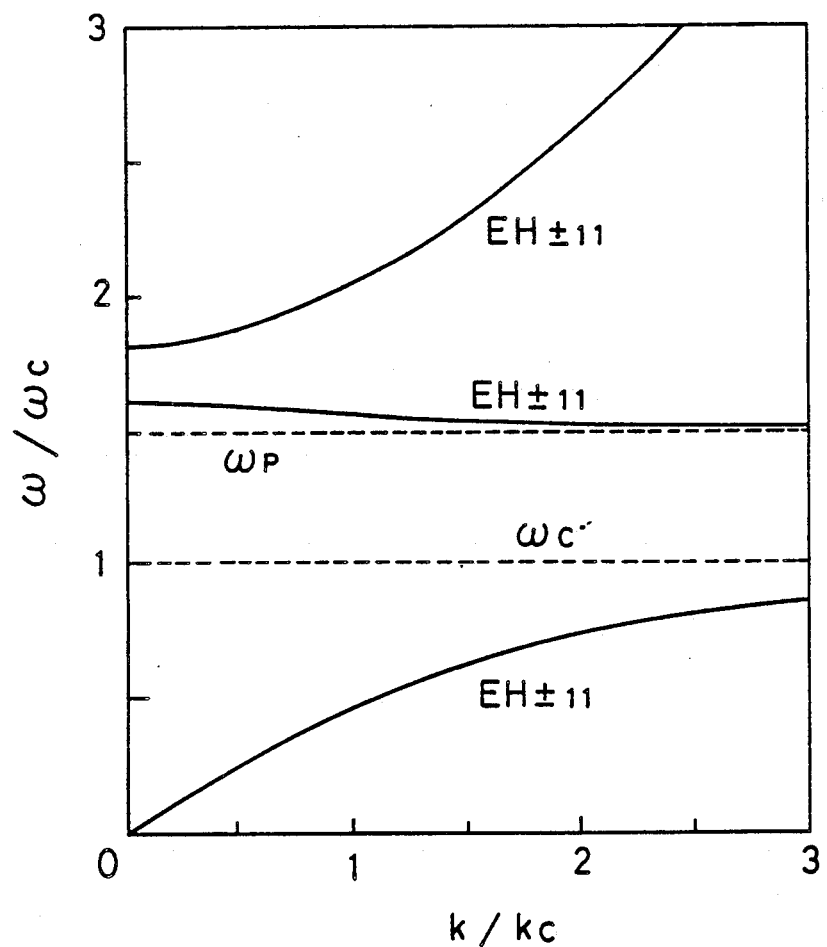
Figure 13:
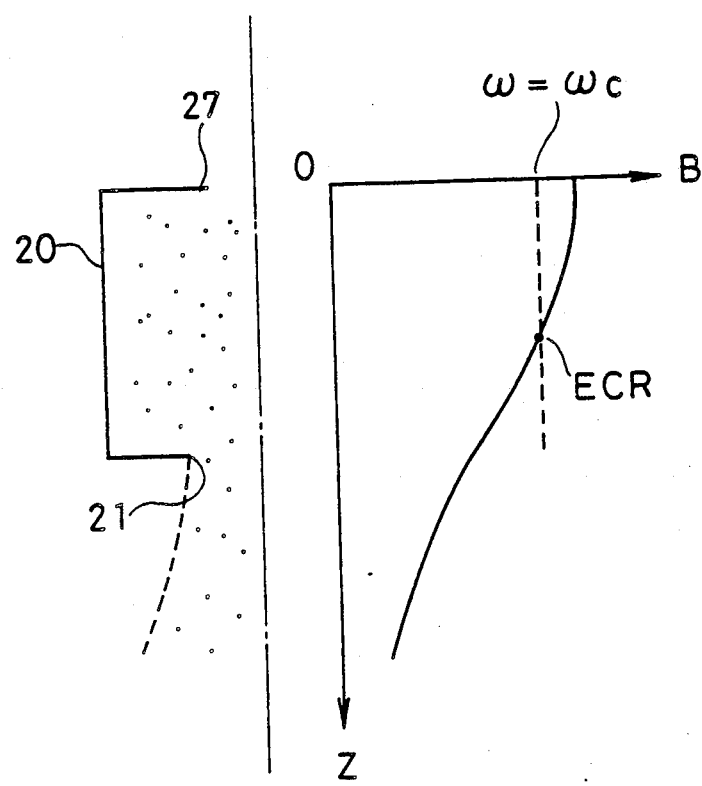
FIG. 13 is a diagram illustrating a profile of a magnetic flux density of the magnetic field in the plasma formation chamber in the plasma processing apparatus in accordance with the present invention.

Referring next to FIGS. 11, 12 and 13, explanation will be made of propagation characteristics of the microwave in the plasma to which the magnetic field generated by the electromagnetic coils 50 is applied.

The dispersion relationships in the respective modes of the microwave propagating through the plasma, that is, the relationships between the frequency $\omega$ and the wave number $k$ are expressed specifically approximately as shown below;

In the case of the HE wave:

$$aTJn'(aT)(\omega^2\epsilon_1\mu_0-k^2)+n\omega^2\epsilon_2\mu_0 Jn(aT)=0$$

where Jn(x): Bessel function and $$T^2 = \left(\epsilon_1 - \frac{\epsilon_2^2}{\epsilon_1}\right)\mu_0\omega^2 - k^2.$$

In the case of the EH wave:

$$Jn(aT)=0$$

and $$T^2 = \frac{\epsilon_3}{\epsilon_1}(\epsilon_1\mu_0\omega^2 - k^2).$$

FIG. 11 illustrates dispersion relationships of the HE wave and FIG. 12 illustrates dispersion relationships of the EH wave in accordance with the present invention.

Here, both the HE wave and the EH wave are hybrid waves and can be referred to as a quasi-TE wave and a quasi-TM wave, respectively.

The frequency $\omega/\omega_c$ obtained by the normalization of the microwave frequency m by the electron cyclotron frequency $\omega_c = eB/m$ is plotted along the axis of ordinate, while the wave number $k/kc$ obtained by the normalization of the wave number k by $kc = \omega_c/c$ (where c is the light speed) is plotted along the axis of abscissa.

In the case of the HE wave shown in FIG. 11, $\omega_c/2\pi$ was determined to be 3 GHz and a plasma radius was determined to be 10 cm, under the conditions that a high density plasma of $\omega_p/\omega_c = 1.5$ was generated with respect to the plasma frequency $$\omega_p = \sqrt{ne^2/\epsilon_0 m}.$$

In FIG. 11, $\omega_H$ is the hybrid resonance frequency and is given by $$\sqrt{\omega_c^2 + \omega_p^2}.$$

In the case of the EH wave shown in FIG. 12, the same calculation conditions as in the case of the HE wave were used. The $EH_{11}$ mode extending from the original point can be utilized to improve the plasma generation efficiency. The high density plasma condition $\omega_p/\omega_c > 1$ was obtained when $\omega_c/2\pi = 2.45$ GHz and the plasma density $\eta$ was $\eta > 7.45 \times 10^{10}$ cm$^{-3}$.

FIG. 13 illustrates the distribution of a magnetic flux density B of the magnetic field in the Z-direction in the plasma formation chamber 20 in the apparatus in accordance with the present invention. When $\omega/2\pi = 2.45$ GHz, the electron cyclotron resonance (ECR) occurs at B=875G and $\omega = \omega_c$ is satisfied.

As is easily understood from FIGS. 11 and 12, at a microwave frequency where $k \to <$, the microwave resonates with the electrons in the plasma, so that the electron cyclotron resonance is conditioned. The HE wave resonates at the frequencies of $\omega_c$ and $\omega_H$, while the EH wave resonates at the frequencies of $\omega_c$ and $\omega_p$. In the case of the EH wave, there is no difference in the characteristic curves between the right-handed wave (n=1) and the left-handed wave (n=-1) of the rotation of the electric field with respect to the propagation direction of the microwave and in the case of the HE wave, the difference is very small.

The HE wave mode and the EH wave mode extending from a point adjacent to the origin are the modes in which the microwave is propagable under the condition that both the plasma and the static magnetic field exist. These modes disappear when $\omega_p \to 0$ (the condition that no plasma is generated) and the conventional waveguide modes of the TE and TM wave are obtained.

In the case of the HE wave, the electric field is strong in the periphery of the waveguide. But, the EH wave has a strong electric field even in the central portion, so that the plasma can be effectively formed. The EH wave resonates at $\omega_p$ under the condition that the density of the plasma is low ($\omega_p < \omega_c$). But, the EH wave resonates at $\omega_c$ under the condition that the density of the plasma is high ($\omega_p > \omega_c$). The frequency $\omega_c$ is determined only by the intensity of the magnetic field, so that it is stable.

Accordingly, in order to increase the intensity of the ECR plasma and to perform excitation stably, the EH wave mode (quasi-TM wave) extending from the original point is effective.

From the results of the above-described theoretical analysis, it is considered that it is effective to utilize a mode extending from a point adjacent to the origin point in the hybrid wave (the EH wave) having an electric field component (a longitudinal wave component) even in the propagation direction of the microwave, as the propagation mode for introducing the microwave from the portion of the strong magnetic field ($\omega_c > \omega$) to the region in which the ECR conditions are satisfied. On the other hand, the microwave which propagates through the rectangular waveguide is the TE wave whose electric field is perpendicular to the propagation direction of the microwave, so that this microwave is not suitable for exciting the hybrid wave (EH wave).

In view of the above, according to the present invention, the TE wave from the rectangular waveguide 33 is introduced into the mode transformer including the dielectric member 63 to induce the TM wave, which is in the dielectric wave mode, whereby the TE and TM waves coexist and the hybrid wave in the propagation mode having the longitudinal wave component is extracted and introduced into the plasma formation chamber 20. As a result, the microwave is easily transformed into the propagation mode in the plasma, so that the energy of the microwave can be efficiently supplied to the plasma region in which the ECR conditions are satisfied and is absorbed. Thus, the plasma formation efficiency is considerably improved.

Fourth Embodiment: (ECR Etching Apparatus)

The plasma processing apparatus shown in FIG. 5 is applied to the ECR etching apparatus disclosed, for example, in J. Vac. Sci. Technol. B4(3) 696 (1986).

More specifically, in the ECR plasma processing apparatus constructed as shown in FIG. 5, an etching gas is introduced into the plasma formation chamber 20 from the gas introduction pipe 22, so that the apparatus can be used as an etching apparatus. In this case, the inner wall of the plasma formation chamber 20 is lined by silica glass so that the inner wall (metal) of the plasma formation chamber 20 is not etched by the etching gas or the specimen (wafer) 40 to be etched is not contaminated by the metal of the inner wall. While in this embodiment the etching gas was supplied from the first gas introduction system 22, both the first and the second gas introduction systems 22 and 24 can be used.

In the ECR etching apparatus thus constructed, the microwave introducing unit 60 in accordance with the present invention is interposed between the rectangular waveguide 33 in the microwave introducing portion and the microwave introducing window 27, so that a part of the TE wave from the rectangular waveguide 33 is transformed into the TM wave by the mode transformer including the dielectric member 63. As a result, the hybrid wave containing a longitudinal wave component is introduced into the plasma formation chamber 20 through the microwave introducing window 27.

Figure 14:
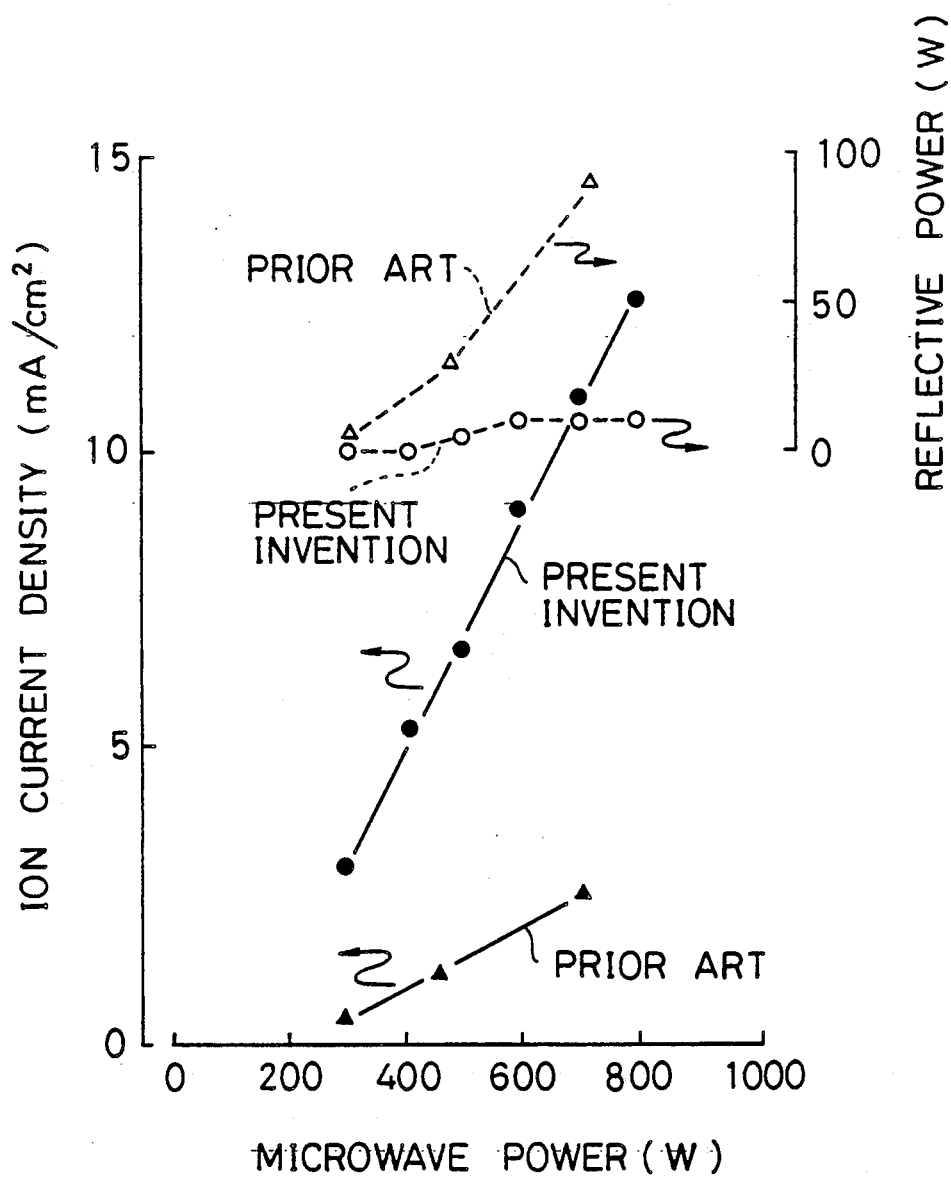
FIG. 14 is a characteristic chart illustrating ion extraction characteristics and reflection characteristics with respect to a microwave power in the cases of the present invention and the prior art.

In the ECR etching apparatus thus constructed, an etching gas consisting of $Cl_2$ 75 volume % and $SF_6$ 25 volume % at the flow rate of 20 sccm was supplied through the gas introduction pipe 22 to the plasma formation chamber 20. In this case, the relationship between the microwave power and the ion current density; that is, the ion extraction characteristics and the reflected microwave power; that is, the microwave reflection characteristics are illustrated in FIG. 14, where the present invention is compared with the prior art. Further, the reflected wave was measured under the condition that the reflected wave was minimized by adjusting the tuner 34.

As is apparent from FIG. 14, according to the present invention, the ion current density was increased by three-four times in response to the introduced power substantially equal to that used in the conventional apparatus. Therefore, a high ion current density of 10 mA/cm$^2$ or more was uniformly obtained in the region having a diameter of 15 cm or more. Furthermore, the reflected wave was 10 W or less, so that the reflected wave was negligible. Therefore, when the introduced microwave power is further increased, the ion current can be further increased. In this embodiment, in order to eliminate the current due to the incident electrons, the measurement of the ion current density was made by a probe biased to a negative voltage of $-50$ V. As the microwave source 31, use was made of a continuous oscillator type source at the frequency of 2.45 GHz, but it is also possible to use other frequencies or an intermittent oscillation type microwave source.

Figure 15:
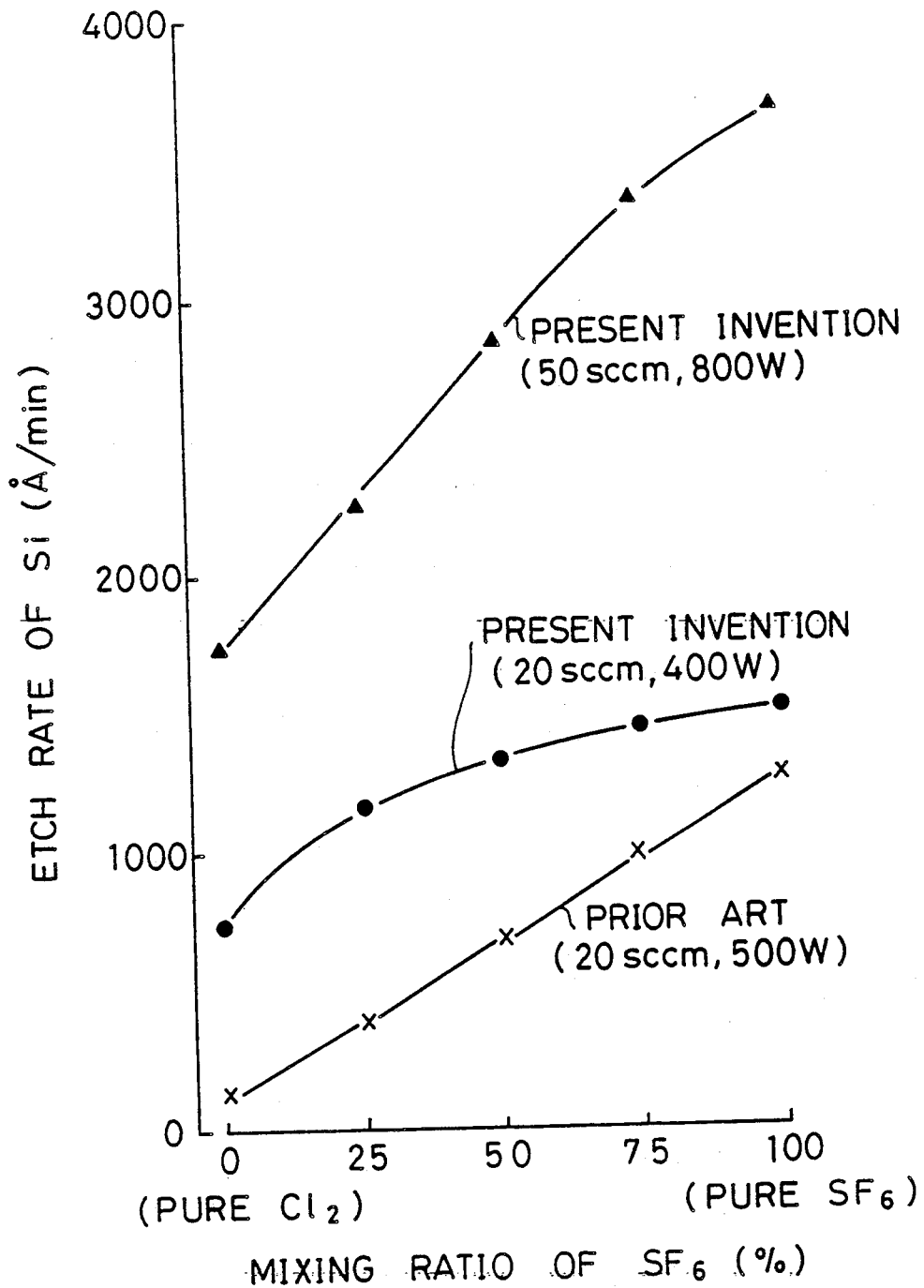
FIG. 15 is a characteristic chart illustrating the relationships between a gas mixing ratio of the etching gases and an etch rate of silicon in the cases of the present invention and the prior art.

FIG. 15 illustrates characteristics of an etch rate for silicon etching when a mixing ratio between $Cl_2$ and $SF_6$ which constitute an etching gas is varied.

When $Cl_2$ is the major component, the etching process is promoted by the ion incidence, so that the etching process can be accomplished at a high degree of accuracy without undercuts. According to the present invention, in this region where $Cl_2$ is substantial, the etch rate can be remarkably increased and especially under the condition that $SF_6$ is 25% or less, the etch rate is remarkably increased by about ten times. In this embodiment, the ECR plasma is extracted by a divergent magnetic field to produce an ion stream. Consequently, the ion energy is low and is of the order of 10–30 eV. Thus, there are advantages in that damages to the silicon specimens can be minimized and in that the characteristics of the selective etching with respect to a primary layer material is satisfactory. In the case of a low energy, the prior art method has a disadvantage that the etch rate is low, but according to the present invention, a sufficiently high etch rate can be attained.

Furthermore, when a bias voltage is additionally applied to the specimen table by a high frequency electric power source in combination with this embodiment, the etch rate can be further increased by a few times. In this case, however, the advantage of the low energy is lost, so that it is advisable to use properly the two manners in accordance with a purpose of use.

As is apparent from FIG. 14, the etch rate is increased by increasing the flow rate of an etching gas and/or the microwave power, so that the throughput can be further increased.

Further, it has been confirmed that the characteristics such as an etching selection ratio, damages to the specimen and so on which are advantageously obtained in the prior art apparatus are not lost.

Figure 16:
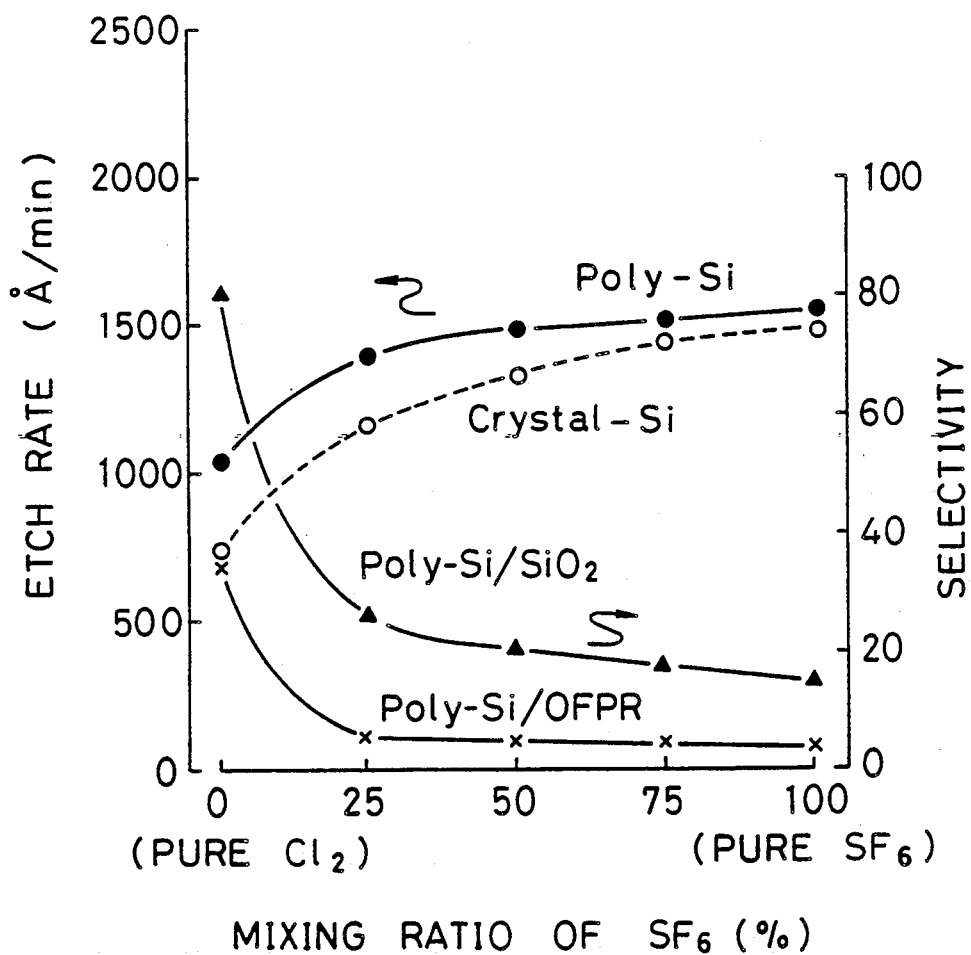
FIG. 16 is a characteristic chart illustrating etching characteristics when the etching of poly silicon is performed in accordance with the present invention.

FIG. 16 illustrates an example of the etching characteristics obtained by the present invention. In this case, a mixed gas consisting of $Cl_2$ and $SF_6$ was used as an etching gas, whose flow rate was 20 sccm (at the pressure of $5.0 \times 10^{-4}$ Torr) and the microwave power was 400 W. FIG. 16 illustrates etch rates in the cases of single crystal silicon and polycrystalline silicon and etching selection ratios in the cases of Poly-Si/SiO$_2$ and Poly-Si/resist (OFPR or AZ).

As is apparent from FIG. 16, the characteristic of a high selection ratio (the ration in the case of Poly-Si/SiO$_2$ is 50 or more) on the side of $Cl_2$ ($Cl_2$ only or containing $SF_6$ slightly) which is a feature of the low energy ion stream etching process is not lost at all, as compared with the prior art ECR method.

As to the evaluation of the crystal defects of Si after the Si etching process, the evaluation results in that this method causes extremely small damage, as compared with the conventional high frequency plasma process.

These results show that the ion current density can be increased by the application of the present invention, while the ion energy is hardly increased, so that the improvement of the throughput does not adversely affect other characteristics.

Fifth Embodiment: (ECR Plasma CVD Apparatus)

The ECR thin film forming apparatus disclosed in U.S. Pat. No. 4,401,054 entitled as "Plasma Deposition Apparatus": or U.S. Pat. No. 4,492,620 entitled as "Plasma Deposition Method and Apparatus" is used and the microwave introduction unit 60 in accordance with the present invention is disposed in the microwave introduction portion of the above-mentioned apparatus, so that a part of the TE wave from the rectangular waveguide 33 is transformed into the TM wave by the mode transformer including the dielectric member 63. The hybrid wave containing a longitudinal wave component is introduced into the plasma formation chamber 20 through the microwave introducing window 27.

Figure 17:
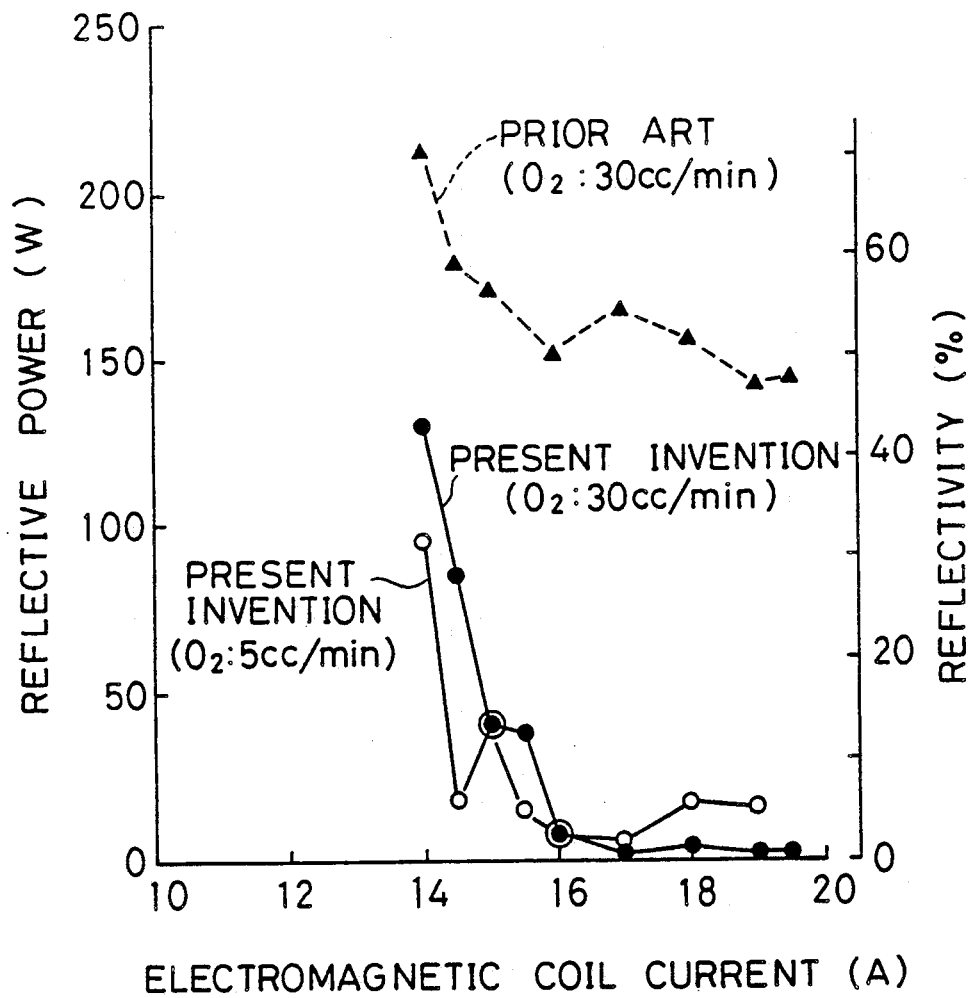
FIG. 17 is a characteristic chart illustrating matching characteristics when the current flowing through the electromagnetic coils are varied in the cases of the present invention and the prior art.

Microwave reflection characteristics, i.e., matching characteristics obtained when a current to be supplied to the electromagnetic coils 50 is varied in the ECR plasma CVD apparatus thus constructed are illustrated in FIG. 17, with comparing the present invention with the prior art.

The power of the incident microwave was 300 W and an O$_2$ gas was introduced into the plasma formation chamber 20 through the gas introduction pipe 22 at the flow rate of 30 cc/min or 5 cc/min. The reflected microwave was measured under a condition that the power of the reflected microwave is minimized by adjusting the tuner 34.

In FIG. 17, when the current supplied to the electromagnetic coils 50 is increased to about 14A, a magnetic flux density of the magnetic field which satisfies the ECR conditions (875G when the frequency of the microwave is 2.45 GHz) appears in one portion within the plasma formation chamber 20, so that the plasma is generated. When the current flowing through the electromagnetic coils 50 is further increased, the magnetic field region which satisfies the ECP: conditions is shifted to the center portion of the plasma formation chamber 20 from the vicinity of the microwave introducing window 27. When the electromagnetic coil current satisfying the ECR conditions is in the range between 16A and 20A, the reflected microwave became 1% or less when the flow rate of the O$_2$ gas was 30 cc/min. Even at the flow rate of 5 cc/min, the reflected microwave became 5-6% or less. Thus, as compared with the prior art, it was recognized that the matching characteristic was remarkably enhanced.

Figure 18:
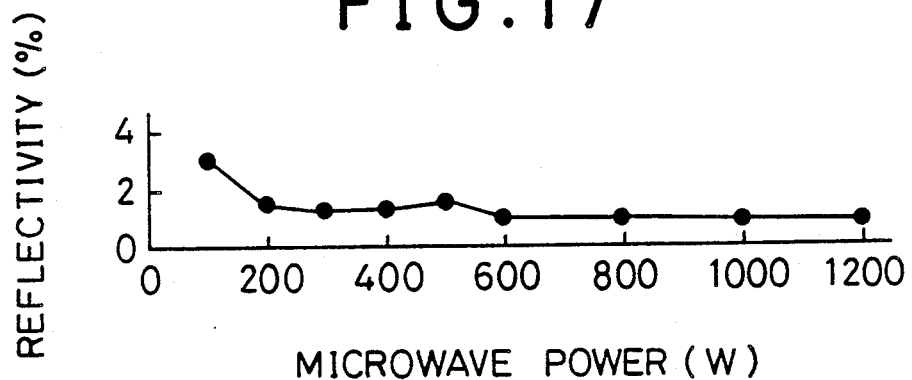
FIG. 18 is a characteristic chart illustrating matching characteristic when a power of the incident microwave is varied in the present invention.

FIG. 18 illustrates the variations in the reflectivity when the power of the incident microwave was varied, in case that the flow rate of the O$_2$ gas was 30 cc/min and the current flowing through the electromagnetic coils 50 was 18A.

As is apparent from FIG. 18, even if the power of the microwave is varied over a wide range, the reflectivity within a low value of 1–2%, so that it is found out that the matching characteristic is improved.

Further, in the above-mentioned apparatus, an intermittent type oscillator was used as the microwave source 31. Thus, even though an instantaneous value of the power; that is, the plasma condition varies from time to time, the satisfactory matching characteristic was attained as illustrated in FIG. 18.

Figure 19:
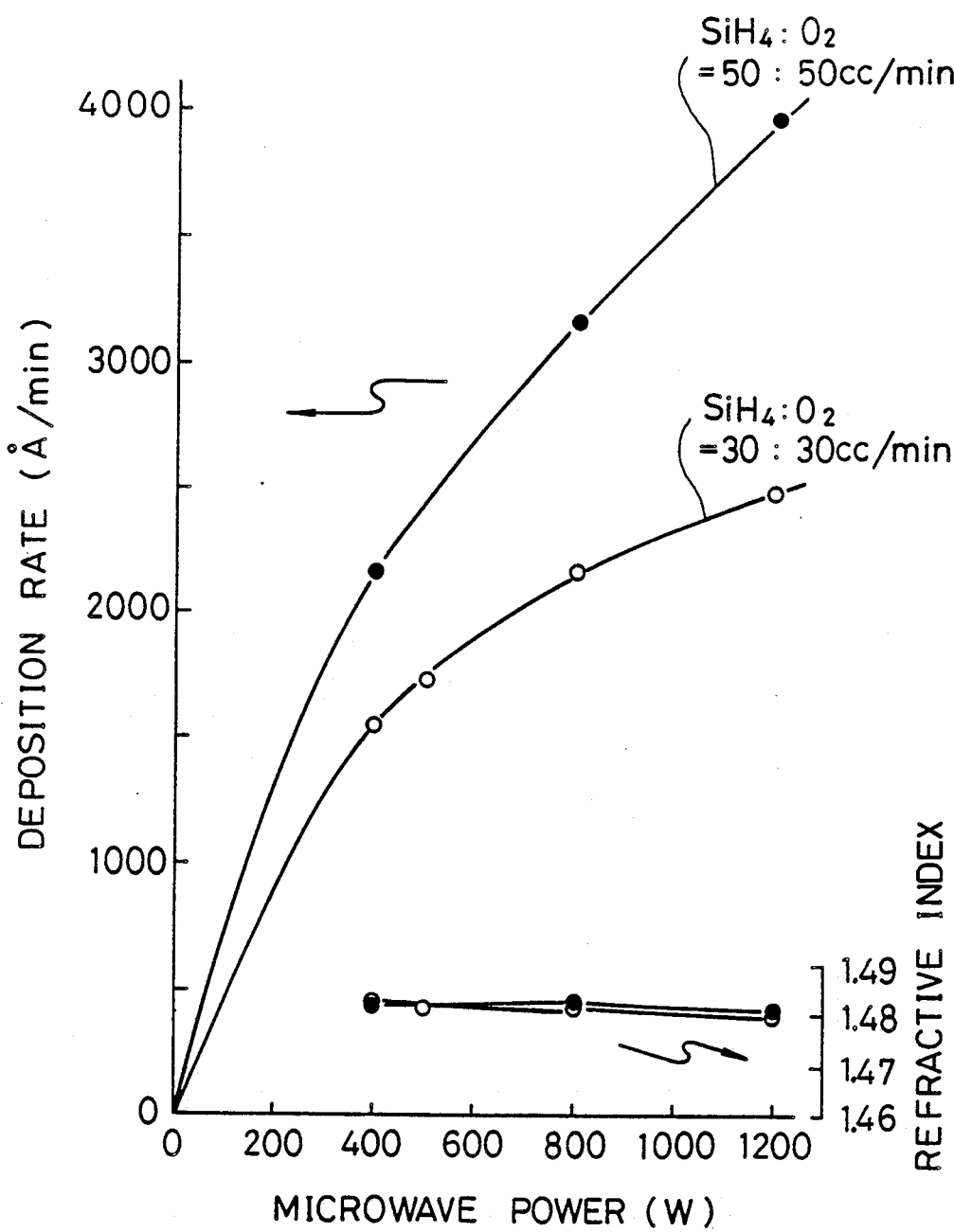
FIG. 19 is a characteristic chart illustrating characteristics of the $SiO_2$ film formation when a power of the microwave is varied in the present invention.

When both the $O_2$ gas and the $SiH_4$ gas were introduced into the above-mentioned CVD apparatus to deposite an $SiO_2$ film, the relationship between the microwave power and the deposition rate and the microwave power and the reflectivity were obtained as illustrated in FIG. 19.

These characteristics show the results measured when the current flowing through the electromagnet coils 50 was 17A; the distance between the specimens 40 on the specimen table 11 and the plasma extracting orifice 21 was 15 cm; and the gas introduction conditions were so determined that the flow rate of the $O_2$ gas was 30 cc/min and 50 cc/min and the flow rate of the $SiH_4$ gas was 30 cc/min and 50 cc/min (in terms of $N_2$). When $SiH_4:O_2 = 50:50$ cc/min, and the power of the microwave was 1200 W, the deposition rate was 4000Å/min, and consequently the film was formed at a rate two or three times as high as the deposition rate obtained by the prior art apparatus. Therefore, the throughput of the film formation was increased. In this case, even when the power of the microwave was increased, the refractive index was maintained substantially at about 1.48% and thus the quality of the grown film was high. Even if the power of the microwave was further increased, the reflectivity was maintained at about 1% or less, so that it is understood that the reflective power was reduced to a negligible level.

So far, even when a high power of the microwave is supplied, the reflected power is increased, so that it is difficult to increase the power of the microwave injected into the plasma. In contrast, according to the present invention, it becomes easy to inject a high power microwave into the plasma. As a result, the deposition rate can be further increased to a high rate (for instance, 1 μm/min) which is two or three times as high as the deposition rate attained by the prior art apparatus by increasing the flow rate of the deposition gas.

Industrial Applicability

As is clear from the above, according to the present invention, the microwave in the TE mode from the rectangular waveguide is supplied to the mode transformer and is partially transformed into the TM wave by the mode transformer, so that the hybrid wave in the propagation mode having an electric field component parallel to the direction of the microwave propagation; that is, a longitudinal wave component is introduced into the plasma formation chamber. As a result, the microwave energy is efficiently supplied to the plasma region which satisfies the ECR conditions and then is absorbed by the plasma, so that the efficiency of the plasma formation is enhanced and accordingly the throughput of the plasma processing is improved.

Furthermore, according to the present invention, the power of the microwave which is reflected back without being introduced into the plasma formation chamber is considerably decreased, so that the microwave is efficiently injected into the plasma. Moreover, according to the present invention, there is an advantage in that the reflectivity is maintained at a low value, even if the power of the microwave is varied over a wide range.

Therefore, according to the present invention, the microwave supply source can be made larger in capacity and in addition the flow rate of the gas to be introduced is increased, so that the throughput of the plasma processing can be further improved.

As a result, the present invention can be equally applied to an ECR plasma etching apparatus and an ECR plasma CVD apparatus, so that the etch rate and the film deposition rate can be improved, respectively. Furthermore, the present invention may be equally applied not only to the above-mentioned apparatuses, but also to other various apparatuses utilizing the microwave plasma such as an ion shower apparatus (for example, the apparatus disclosed in U.S Pat. No. 4,450,031), an ion beam apparatus, an ECR plasma sputtering apparatus and so on, so that their characteristics such as the ion current can be improved.

The invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

We claim:

1. A plasma processing method in which a gas to be activated into a plasma is introduced into a plasma formation chamber and input microwave energy from a microwave source is supplied to said plasma formation chamber, so that said gas is activated into the plasma by electron cyclotron resonance, said method comprising the steps of:

receiving the input microwave energy in a first propagation mode from said microwave source;

transforming at least a part of said input microwave energy into microwave energy in a second propagation mode having an electric field component in the direction of the propagation of said input microwave energy; and introducing a combination of microwave energy in said first propagation mode which is not transformed and said microwave energy in said second propagation mode which is transformed into said plasma formation chamber through a microwave introducing window.

2. A plasma processing method as claimed in claim 1, wherein said input microwave energy from said microwave source is propagated in a TE mode through a rectangular waveguide; at least a part of the microwave energy in the TE mode is transformed into microwave energy in a TM mode; and a combination of microwave energy in said TE mode which is not transformed and said microwave energy in said TM mode which is transformed is supplied to said plasma formation chamber.

3. A plasma processing apparatus having a microwave source for generating input microwave energy and a plasma formation chamber into which a gas to be activated into a plasma is introduced and to which said input microwave energy from said microwave source is supplied through a microwave introducing window provided in said plasma formation chamber, so that said gas is activated into said plasma by electron cyclotron resonance, said apparatus comprising:

a transformer receiving the input microwave energy in a first propagation mode from said microwave source; and for transforming at least a part of said input microwave energy into microwave energy in a second propagation mode having an electric field component in the direction of the propagation of said input microwave energy and for introducing a combination of microwave energy in said first propagation mode which is not transformed and said microwave energy in said second propagation mode which is transformed into said plasma formation chamber through said microwave introducing window.

4. A plasma processing apparatus as claimed in claim 3, wherein said transformer has a first waveguide and a dielectric member disposed in and extending through said first waveguide.

5. A plasma processing apparatus as claimed in claim 4, wherein said first waveguide is a circular waveguide, and further comprising a rectangular waveguide for propagating in a TE mode the input microwave energy from said microwave source and a tapered waveguide interposed between said rectangular waveguide and said circular waveguide, and in said circular waveguide, at least a part of the microwave energy in the TE mode introduced into said circular waveguide from said tapered waveguide being transformed into microwave energy in a TM mode, and a combination of microwave energy in said TE mode which is not transformed and said microwave energy in said TM mode which is transformed being derived from said circular waveguide.

6. A plasma processing as claimed in claim 4, wherein said first waveguide is a tapered waveguide, and further comprising a rectangular waveguide for propagating in a TE mode the input microwave energy from said microwave source, the microwave energy in the TE mode from said rectangular waveguide being introduced into said tapered waveguide, so that at least a part of the introduced microwave energy in said TE mode is transformed into microwave energy in a TM mode, and a combination of microwave energy in said TE mode which is not transformed and said microwave energy in said TM mode which is transformed is derived from said tapered waveguide.

7. A plasma processing apparatus as claimed in claim 3, wherein said dielectric member is a dielectric plate having major planes which are disposed in parallel with the direction of the propagation of said input microwave energy introduced into said transformer and perpendicular to the direction of the electric field of said input microwave energy introduced into said transformer.

8. A plasma processing apparatus as claimed in claim 7, wherein said first waveguide has grooves for guiding said dielectric plate.

9. A plasma processing apparatus as claimed in claim 3, wherein said dielectric plate is a silica glass plate.

10. A plasma processing apparatus as claimed in claim 3, further comprising a second dielectric plate disposed on said microwave introducing window.

11. A mode transformer for a plasma processing apparatus having microwave source for generating input microwave energy and a plasma formation chamber into which a gas to be activated into a plasma is introduced and to which said input microwave energy from said microwave source is supplied through a microwave introducing window provided in said plasma formation chamber, so that said gas is activated into said plasma by electron cyclotron resonance, said mode transformer comprising:

a first member receiving the input microwave energy in a first propagation mode from said microwave source and for transforming at least a part of said input microwave energy into microwave energy in a second propagation mode having an electric field component in the direction of the propagation of said input microwave energy; and a second member for introducing a combination of microwave energy in said first propagation mode which is not transformed and said microwave energy in said second propagation mode which is transformed into said plasma formation chamber through said microwave introducing window.

12. A mode transformer for a plasma processing apparatus as claimed in claim 11, wherein said second member has a first waveguide and said first member has a dielectric member disposed in and extending through said first waveguide.

13. A mode transformer for a plasma processing apparatus as claimed in claim 12, wherein said first waveguide is a circular waveguide, and further comprising a rectangular waveguide for propagating in a TE mode the input microwave energy from said microwave source and a tapered waveguide interposed between said rectangular waveguide and said circular waveguide, and in said circular waveguide, at least a part of the microwave energy in the TE mode introduced into said circular waveguide from said tapered waveguide being transformed into microwave energy in a TM mode, and a combination of microwave energy in said TE mode which is not transformed and said microwave energy in said TM mode which is transformed being derived from said circular waveguide.

14. A mode transformer for a plasma processing apparatus as claimed in claim 12, wherein said first waveguide is a tapered waveguide, and further comprising a rectangular waveguide for propagating in a TE mode the input microwave energy from said microwave source, the microwave energy in the TE mode from said rectangular waveguide being introduced into said tapered waveguide, so that at least a part of the introduced microwave energy in said TE mode is transformed into microwave energy in a TM mode, and a combination of microwave energy in said TE mode which is not transformed and said microwave energy in said TM mode which is transformed is derived from said tapered waveguide.

15. A mode transformer for a plasma processing apparatus as claimed in claim 11, wherein said dielectric member is a dielectric plate having major planes which are disposed in parallel with the direction of the propagation of said input microwave energy introduced into said mode transformer and perpendicular to the direction of the electric field of said input microwave energy introduced into said mode transformer.

16. A mode transformer for a plasma processing apparatus as claimed in claim 15, wherein said first waveguide has grooves for guiding said dielectric plate.

17. A mode transformer for a plasma processing apparatus as claimed in claim 11, wherein said dielectric plate is a silica glass plate.

18. A mode transformer for a plasma processing apparatus as claimed in claim 11, further comprising a second dielectric plate disposed on said microwave introducing window.

* * * * *

UNITED STATES PATENT AND TRADEMARK OFFICE
CERTIFICATE OF CORRECTION

PATENT NO. : 5,003,152

DATED : March 26th, 1991

INVENTOR(S) : Seitaro MATSUO ET AL.

It is certified that error appears in the above-identified patent and that said Letters Patent is hereby corrected as shown below:

Title page:

-- [54] MICROWAVE TRANSFORMING METHOD AND APPARATUS FOR PLASMA

PROCESSING --

Signed and Sealed this

Twenty-ninth Day of September, 1992

Attest:

DOUGLAS B. COMER

Attesting Officer

Acting Commissioner of Patents and Trademarks